United States Patent
Yamaguchi

(10) Patent No.: US 12,510,464 B2
(45) Date of Patent: Dec. 30, 2025

(54) MEASURING DEVICE, MEASURING METHOD, SUBSTRATE PROCESSING APPARATUS, AND METHOD OF MANUFACTURING PRODUCT

(71) Applicant: CANON KABUSHIKI KAISHA, Tokyo (JP)

(72) Inventor: Wataru Yamaguchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 459 days.

(21) Appl. No.: 17/815,412

(22) Filed: Jul. 27, 2022

(65) Prior Publication Data
US 2023/0030661 A1 Feb. 2, 2023

(30) Foreign Application Priority Data
Jul. 29, 2021 (JP) ................. 2021-124628

(51) Int. Cl.
| | | |
|---|---|---|
| G01N 21/01 | (2006.01) | |
| G01N 21/27 | (2006.01) | |
| G03F 7/00 | (2006.01) | |
| G03F 7/20 | (2006.01) | |

(52) U.S. Cl.
CPC ............. *G01N 21/01* (2013.01); *G01N 21/27* (2013.01); *G03F 7/70625* (2013.01)

(58) Field of Classification Search
CPC . G03F 7/70625; G03F 7/70633; G01N 21/27; G01N 21/01
See application file for complete search history.

(56) References Cited

U.S. PATENT DOCUMENTS

| | | | | |
|---|---|---|---|---|
| 4,732,485 A | * | 3/1988 | Morita .................. | G01B 11/24 250/559.22 |
| 4,744,660 A | * | 5/1988 | Noguchi ................ | G01B 11/22 359/370 |

(Continued)

FOREIGN PATENT DOCUMENTS

| | | |
|---|---|---|
| JP | H07263321 A | 10/1995 |
| JP | 2006-078283 A | 3/2006 |

(Continued)

*Primary Examiner* — Sang H Nguyen
(74) *Attorney, Agent, or Firm* — Canon U.S.A., Inc. IP Division

(57) ABSTRACT

A measuring device for measuring a position of a pattern includes a wavelength variable unit configured to vary a spectrum of first light in accordance with an incident position at which the first light is incident to allow the first light to pass therethrough, and a moving unit configured to change the incident position by moving the wavelength variable unit. The wavelength variable unit is moved to a position based on wavelength characteristic information and intensity characteristic information, the wavelength characteristic information indicating a relationship between the position of the wavelength variable unit and a wavelength of the first light transmitted through the wavelength variable unit, the intensity characteristic information indicating a relationship between the position of the wavelength variable unit and an intensity of second light from the pattern illuminated with the first light transmitted through the wavelength variable unit.

28 Claims, 11 Drawing Sheets

(56) References Cited

U.S. PATENT DOCUMENTS

| | | | | |
|---|---|---|---|---|
| 5,184,193 A | * | 2/1993 | LeFebre | G01J 3/08 |
| | | | | 356/325 |
| 2002/0001405 A1 | * | 1/2002 | Yonezawa | G01N 21/95607 |
| | | | | 382/149 |
| 2002/0066859 A1 | * | 6/2002 | Ino | G01J 5/0003 |
| | | | | 250/339.04 |
| 2005/0002035 A1 | * | 1/2005 | Mishima | G03F 9/7026 |
| | | | | 355/53 |
| 2005/0094160 A1 | * | 5/2005 | Murai | G01B 11/0625 |
| | | | | 356/419 |
| 2008/0283723 A1 | * | 11/2008 | Fujimori | G01B 11/0625 |
| | | | | 250/201.3 |
| 2020/0257100 A1 | * | 8/2020 | Putman | G02B 21/365 |

FOREIGN PATENT DOCUMENTS

| | | |
|---|---|---|
| JP | 2017-199725 A | 11/2017 |
| JP | 2017-532587 A | 11/2017 |
| JP | 6568041 B2 | 8/2019 |
| JP | 2019-196943 A | 11/2019 |
| TW | 201947330 A | 12/2019 |

\* cited by examiner

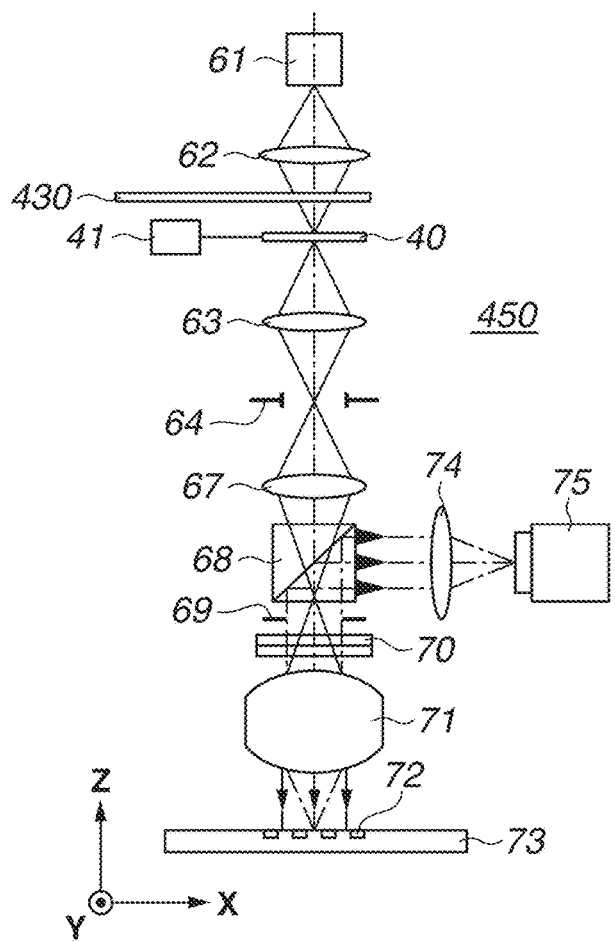
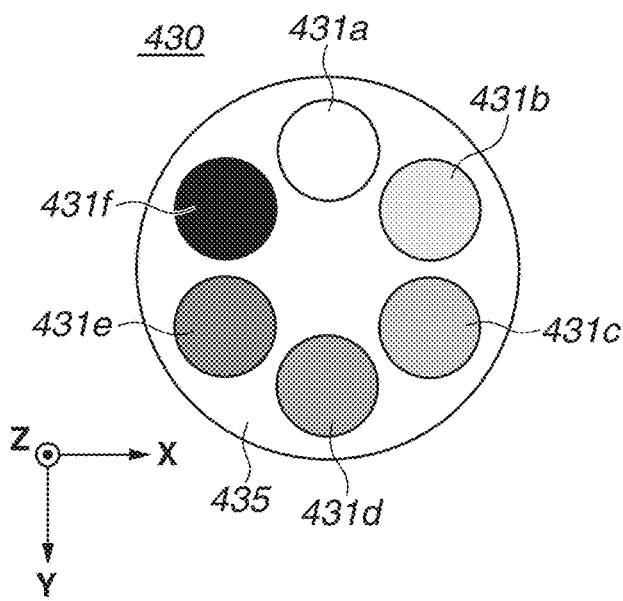
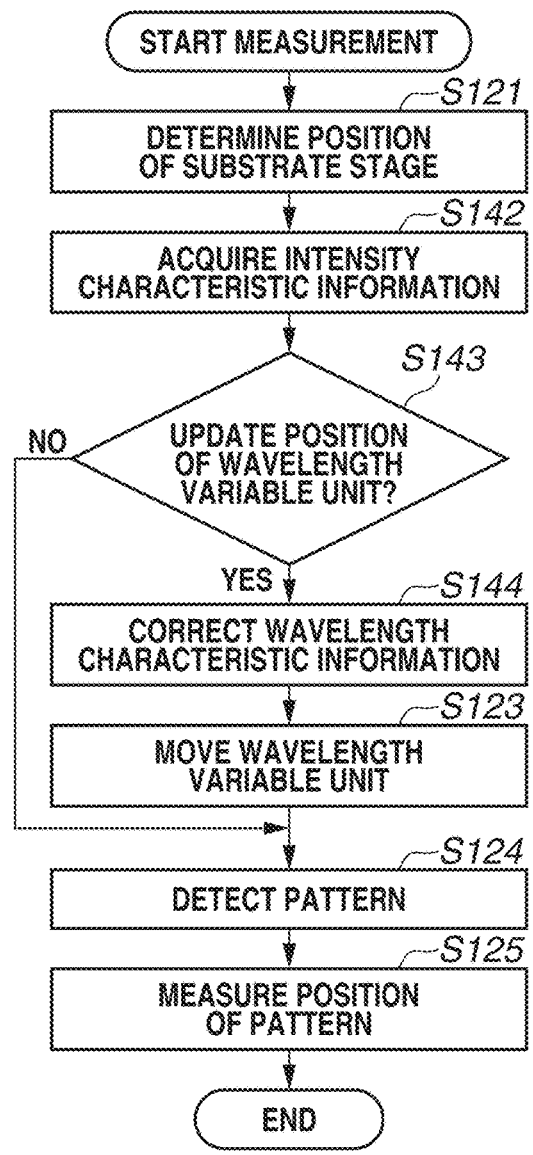

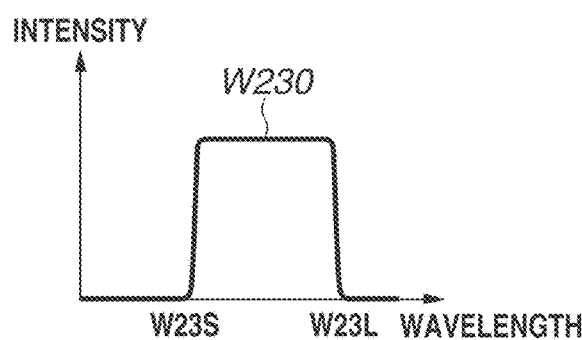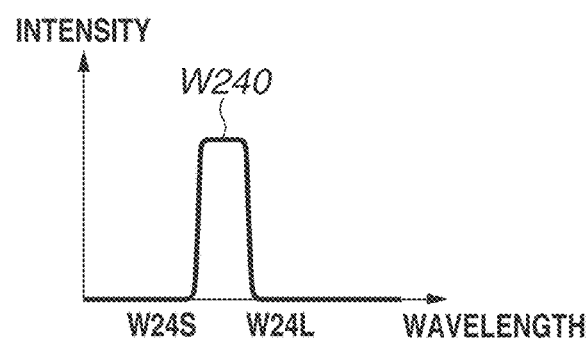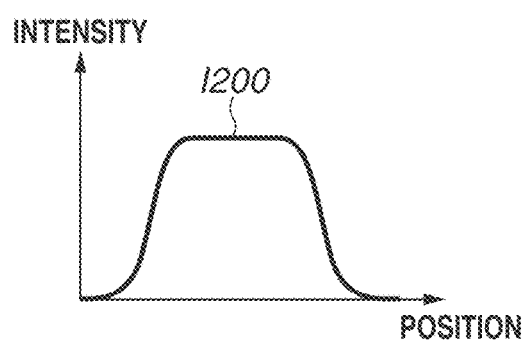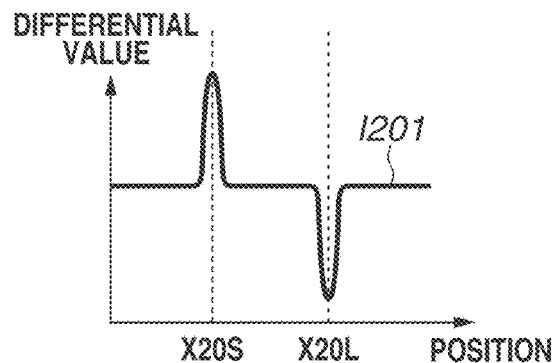

MEASURING DEVICE, MEASURING METHOD, SUBSTRATE PROCESSING APPARATUS, AND METHOD OF MANUFACTURING PRODUCT

BACKGROUND

Field of the Disclosure

The present disclosure relates to a measuring device, a measuring method, a substrate processing apparatus, and a method of manufacturing a product.

Description of the Related Art

In manufacturing of products, such as a semiconductor device, a microelectromechanical system (MEMS), a color filter, and a flat panel display, a pattern formed on a substrate is getting more and more miniaturized, and there is increasing demand for improvement in dimension accuracy of the pattern.

Thus, a substrate processing apparatus that processes a substrate is required to highly accurately measure the position on the substrate on which a pattern is formed. Examples of the substrate processing apparatus include an exposure apparatus that exposes a substrate to light for forming a pattern onto the substrate. In the exposure apparatus, by forming an image at a predetermined position on the substrate using exposure light emitted via a projection optical system, and moving a stage on which the substrate is placed, a pattern is formed onto the substrate. To adjust a relative position between the predetermined position on the substrate on which the pattern is to be formed and exposure light, the accuracy of measuring a pattern on the substrate, and the accuracy of measuring a relative position between patterns formed in different layers on the substrate become important.

As a method of measuring the position of a pattern formed on a substrate (hereinafter, will be simply referred to as a pattern), there is a method of illuminating a pattern and detecting light reflected by the pattern. As a method of measuring a pattern more accurately, there is a method of selecting a wavelength of light to be used for illuminating a pattern, in accordance with physical characteristics and optical characteristics of the pattern and a pattern peripheral portion. The physicality of material forming the pattern and the shape of the pattern vary depending on a step of processing the substrate. Thus, by illuminating the pattern with light having a wavelength selected in accordance with the step of processing the substrate, the intensity of a detected signal of light reflected from the pattern increases, and an error of the detected signal is reduced. This improves the accuracy in measuring the position of the pattern.

Japanese Patent No. 6568041 discusses an imaging system that captures an image of a sample. While varying a wavelength of light to be emitted onto the sample, the imaging system captures an image of the sample in synchronization with a variation in the wavelength. Japanese Patent No. 6568041 further discusses that a light source device included in the imaging system varies the wavelength of light to be emitted onto a sample through a filter, by driving the filter.

In the technique discussed in Japanese Patent No. 6568041, in a case where a position of a filter to be driven shifts from a target position, an error occurs in the wavelength of light to be emitted onto a sample through the filter. This may result in that light having a wavelength desirable for capturing an image of a sample fails to be emitted onto the sample.

SUMMARY

The present disclosure is directed to a measuring device, a measuring method, a substrate processing apparatus, and a manufacturing method of a product that can increase the intensity of a detected signal of light and reduce an error of the detected signal.

According to an aspect of the present invention, a measuring device for measuring a position of a pattern by illuminating the pattern with first light and detecting second light from the pattern includes a wavelength variable unit configured to vary a spectrum of the first light in accordance with an incident position at which the first light is incident to allow the first light to pass therethrough, and a moving unit configured to change the incident position by moving the wavelength variable unit. The wavelength variable unit is moved to a position based on wavelength characteristic information and intensity characteristic information, the wavelength characteristic information indicating a relationship between the position of the wavelength variable unit and a wavelength of the first light transmitted through the wavelength variable unit, the intensity characteristic information indicating a relationship between the position of the wavelength variable unit and an intensity of the second light from the pattern illuminated with the first light transmitted through the wavelength variable unit.

Further features of the present invention will become apparent from the following description of exemplary embodiments with reference to the attached drawings.

BRIEF DESCRIPTION OF THE DRAWINGS

FIGS. 5A, 5B, and 5C are diagrams illustrating a measuring device and a measuring method according to a fourth exemplary embodiment.

FIGS. 6A, 6B, 6C, and 6D are diagrams illustrating the measuring method according to the fourth exemplary embodiment.

DESCRIPTION OF THE EMBODIMENTS

Figure 1A:
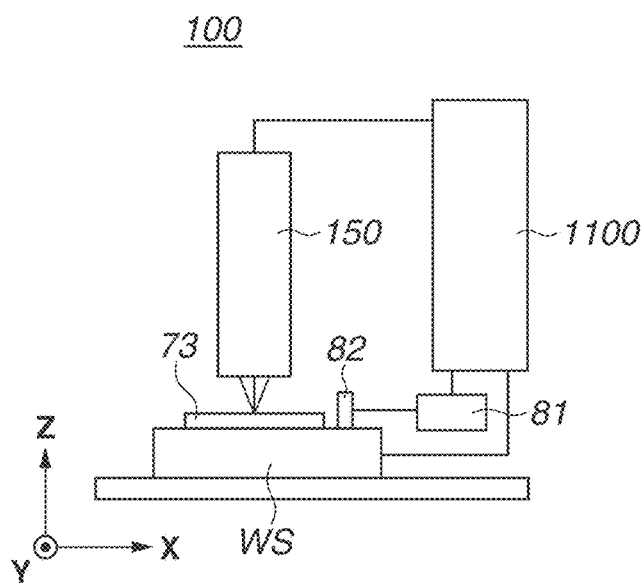
FIGS. 1A, 1B, 1C, and 1D are diagrams illustrating a measuring device according to a first exemplary embodiment.

Hereinafter, exemplary embodiments of the present invention will be described in detail with reference to the accompanying drawings. In the drawings, the same members are assigned the same reference numerals, and the redundant description will be omitted. The present invention is not limited to the following exemplary embodiments. The following exemplary embodiments merely indicate specific examples advantageous in carrying out the present invention. Not all the combinations of features described in the following exemplary embodiments are always essential to the solution of the present invention.

A first exemplary embodiment of the present invention will be described below. A measuring device according to the first exemplary embodiment will be described. FIGS. 1A, 1B, 1C, and 1D are diagrams illustrating a measuring device according to the first exemplary embodiment. In the following description, a direction parallel to an optical axis of an objective optical system 71 to be described below will be described as a Z-axis direction, and two directions orthogonal to each other in a direction along a plane vertical to the Z-axis direction will be described as an X-axis direction and a Y-axis direction. A rotational direction about an X-axis, a rotational direction about a Y-axis, and a rotational direction about a Z-axis will be described as a θX direction, a θY direction, and a θZ direction, respectively.

FIG. 1A is a diagram illustrating a configuration of a measuring device 100. The measuring device 100 measures, for example, positions in the X-axis direction and the Y-axis direction of a pattern provided on a substrate 73. The measuring device 100 may measure, for example, positions in the X-axis direction and the Y-axis direction of patterns provided in different layers on the substrate 73, to measure a distance between the patterns. The measuring device 100 includes a substrate stage WS holding the substrate 73, a measuring unit 150, and a control unit 1100.

The substrate 73 is a target object for which an alignment error and/or an overlay error are/is to be measured by the measuring device 100. The substrate 73 is used for manufacturing a device, such as a semiconductor device and a liquid crystal display element. Specific examples of the substrate 73 include a wafer, a liquid crystal substrate, and other substrates to be processed.

The substrate stage WS is configured to hold the substrate 73 via a substrate chuck (not illustrated), and be drivable by a stage drive unit (not illustrated). The stage drive unit includes a linear motor, and can move the substrate 73 held by the substrate stage WS, by driving the substrate stage WS in the X-axis direction, the Y-axis direction, the Z-axis direction, the θX direction, the θY direction, and the θZ direction. A mirror 82 is provided on the substrate stage WS. A laser interferometer 81 is provided at a position facing the mirror 82. The laser interferometer 81 measures a position of the substrate stage WS in the X-axis direction by measuring a distance to the mirror 82 in the X-axis direction. Laser interferometers (not illustrated) for similarly measuring positions of the substrate stage WS in the X-axis direction and the Z-axis direction are respectively provided. The positions of the substrate stage WS are measured in real time by these laser interferometers, and the obtained measurement result is output to the control unit 1100. Thus, the substrate stage WS is driven to a predetermined position under the control of the control unit 1100. The measuring device 100 may include a scale arranged on the substrate stage WS, and an encoder that measures the position of the substrate stage WS by detecting the position of the scale.

The control unit 1100 operates the measuring device 100 by comprehensively controlling the components of the measuring device 100. The control unit 1100 also executes measurement processing in the measuring device 100, and calculation processing for a measurement value obtained by the measuring device 100. The control unit 1100 includes a computer (information processing apparatus). For example, the control unit 1100 includes a processing unit including a processor such as a central processing unit (CPU) that performs calculation for control in accordance with programs, and a storage unit such as a read-only memory (ROM) storing control programs and fixed data, and a random access memory (RAM) serving as a work area of the processing unit and storing temporary data. The control unit 1100 may include, as a storage unit, a magnetic storage device (hard disc drive (HDD)) that can store larger-volume data than a ROM and a RAM. The control unit 1100 may include, as a storage unit, a drive device that performs data reading and writing with attachment of an external medium, such as a compact disc (CD), a digital versatile disc (DVD), and a memory card. In the present exemplary embodiment, at least one of a ROM, a RAM, a magnetic storage device, and a drive device is used as a storage unit, and the storage unit stores control programs, fixed data, a work area of the processing unit, and temporary data.

Figure 1B:
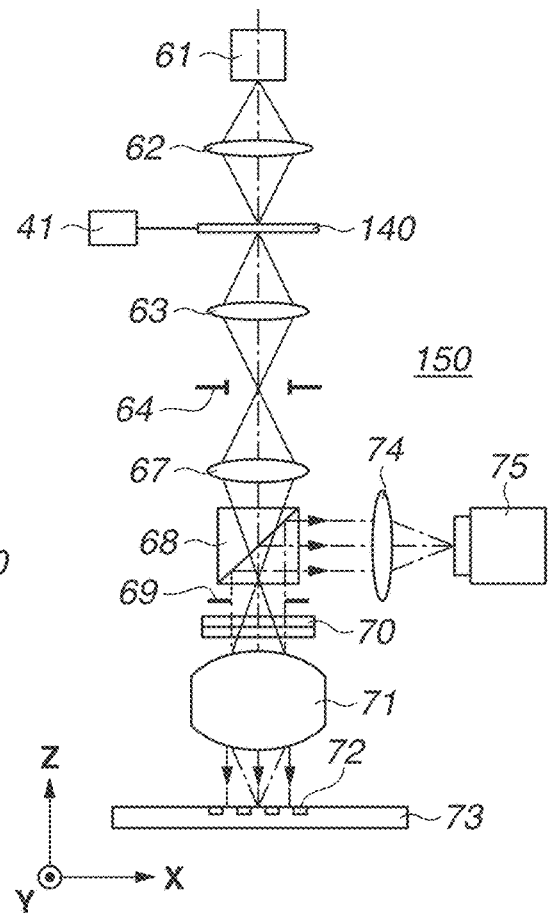

The measuring unit 150 illuminates a pattern provided on the substrate 73, detects light from the pattern, and captures an image of the pattern provided on the substrate 73. FIG. 1B is a diagram illustrating a configuration of the measuring unit 150. The measuring unit 150 includes an illumination unit that illuminates the substrate 73 with light from a light source 61, and an image forming system (detection system) that forms an image onto a detection unit 75 using light from a pattern 72 (forms an image of the pattern 72). The detection unit 75 includes a light receiving unit (not illustrated) that receives light from the pattern 72, and acquires a detected signal of light received by the light receiving unit. The detection unit 75 can function as an imaging unit that forms an imaging region for capturing an image of the pattern 72 by the light receiving unit. The pattern 72 is a used for measuring an alignment error or an overlay error on the substrate 73. The position of the pattern 72 is measured based on a detected signal acquired by the detection unit 75.

Light (first light) emitted from the light source 61 is guided to a wavelength variable unit 140 via an illumination optical system (first optical system) 62. For example, a light source such as a laser light source, a light-emitting diode (LED), or a halogen lamp can be used as the light source 61. The wavelength variable unit 140 is driven (moved) by a drive unit 41 (moving unit). The drive unit 41 includes a driving unit such as a linear motor. By driving (moving) the wavelength variable unit 140 in the X-axis direction (a predetermined direction vertical to an optical axis), the drive unit 41 can move a wavelength variable member 142 held by the wavelength variable unit 140. The position of the wavelength variable unit 140 is measured by an encoder or an interferometer, for example. The wavelength variable unit 140 is controlled by the control unit 1100 to be driven to a predetermined position.

Figure 1C:
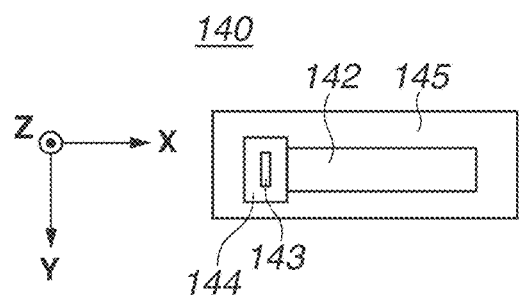

The configuration of the wavelength variable unit 140 will now be described. FIG. 1C is a diagram illustrating the wavelength variable unit 140 according to the present exemplary embodiment. The wavelength variable unit 140 includes the wavelength variable member (first member) 142, an opening forming member (second member) 144, and a holding member 145. The wavelength variable member 142 includes a wavelength variable element that varies a relationship (hereinafter, will be referred to as a spectrum) between a wavelength and an intensity of light to be transmitted, in accordance with the position and the angle of incident light. Here, the spectrum can include information indicating a relationship of light intensity with respect to light wavelength, for example. The spectrum can include information regarding a light wavelength at which a light intensity becomes the largest, the smallest, or a predetermined value, for example. The spectrum can include information regarding a light wavelength band in which a light intensity becomes a value falling within a predetermined range, for example. The spectrum can include information regarding a waveform of a spectrum, for example.

By aligning the position of the wavelength variable unit 140 using the drive unit 41 based on a preliminarily-acquired relationship between a position of the wavelength variable unit 140 in a predetermined direction vertical to an optical axis, and a wavelength of light to be transmitted through the wavelength variable unit 140, the substrate 73 can be illuminated with light having a desired wavelength. Here, the predetermined direction vertical to the optical axis is vertical to an optical axis of an illumination optical system 62 or 63, a relay lens 67, or the objective optical system 71, which will be described below, and is the X-axis direction or the Y-axis direction, for example. The drive unit 41 may also move a position in a predetermined rotational direction of the wavelength variable unit 140 by driving the wavelength variable unit 140 not only in a predetermined direction (e.g., the X-axis direction) vertical to an optical axis, but also in a rotational direction (e.g., the θX direction) about a predetermined axis vertical to the optical axis. The relationship between a position and a wavelength will be described in detail below.

In this manner, by changing the position and the angle of the wavelength variable member 142 using the drive unit 41, a wavelength of light to be transmitted through the wavelength variable member 142 can be varied. For example, a transmission wavelength variable filter can be used as the wavelength variable member 142. The transmission wavelength variable filter is a bandpass filter including a multilayer lamination film formed on a surface on which light is incident, for example. The transmission wavelength variable filter is formed in such a manner that a film thickness of the multilayer lamination film becomes thicker along a wavelength varying direction. With this configuration, a wavelength of light to be transmitted continuously varies due to the interference of light. For example, a transmission type diffractive grating that divides light into light components having different wavelengths, by a diffractive grating formed on a member that allows light to pass therethrough can also be used as the wavelength variable member 142.

Figure 1D:
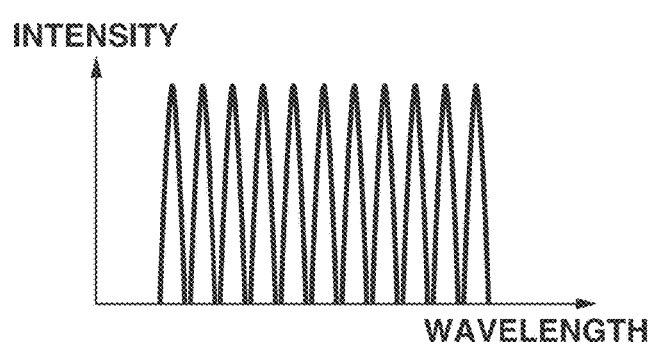

FIG. 1D is a diagram illustrating a relationship between a wavelength and an intensity of light transmitted through the wavelength variable member 142. FIG. 1D illustrates a relationship between a wavelength and an intensity of light transmitted through the wavelength variable member 142 in a case where the wavelength variable member 142 is arranged at a plurality of discrete positions in the X-axis direction. A light incident position varies in accordance with the position of the wavelength variable member 142, and a wavelength of light transmitted through the wavelength variable member 142 varies. An absolute position of light incident on the wavelength variable unit 140 does not vary in the measuring unit 150, so that a relative position of light incident on the wavelength variable unit 140 is varied by driving the wavelength variable unit 140 using the drive unit 41. Thus, in the measuring unit 150 illustrated in FIG. 1A, the wavelength variable unit 140 is driven in the X-axis direction by the drive unit 41, and the position of the wavelength variable member 142 varies with respect to incident light, thus adjusting the wavelength of light to be used for illuminating the substrate 73.

Returning back to FIG. 1C, the opening forming member 144 includes an opening 143 through which incident light is transmitted, and does not vary a wavelength of light to be transmitted. The opening forming member 144 is arranged at a position different in the X-axis direction from the wavelength variable member 142. The opening 143 is arranged on the same plane (XY plane) as the wavelength variable member 142, which is vertical to the optical axis. The opening 143 is formed in such a manner that a length thereof in a longer side direction (X-axis direction) is smaller than a light flux diameter of light incident on the opening 143. In the example illustrated in FIG. 1C, the shape of the opening 143 is a rectangle in which a side in the X-axis direction is shorter than a side in the Y-axis direction, but the shape of the opening 143 is not limited to this shape. The shape of the opening 143 may be a circular shape or a square, or may be a rectangle in which a side in the X-axis direction is longer than a side in the Y-axis direction. By elongating a length in the longer side direction (X-axis direction) of the opening 143, the intensity of light can be increased. By contrast, by shortening a length in the longer side direction of the opening 143, a range in the X-axis direction of light transmitted through the opening 143 becomes narrower, and the detection accuracy of a peak position of light intensity improves. It is therefore desirable to determine a length in the longer side direction of the opening 143 in view of a light intensity and detection accuracy. The opening forming member 144 may include an optical element that does not vary a wavelength of light to be transmitted.

The opening forming member 144 blocks light incident on a peripheral region of the opening 143. The peripheral region of the opening 143 includes a region between the opening 143 and the wavelength variable member 142. The holding member 145 holds the wavelength variable member 142 and the opening forming member 144. By the wavelength variable unit 140 being driven in the X-axis direction by the drive unit 41, a light incident position in the X-axis direction can be adjusted to a desired position. With this configuration, light emitted from the light source 61 is transmitted through the opening 143 or the wavelength variable member 142, and is used for illuminating the substrate 73.

Returning back to FIG. 1B, light transmitted through the wavelength variable unit 140 is incident on an illumination aperture stop 64 via the illumination optical system (first optical system) 63. At the illumination aperture stop 64, a light flux diameter of light becomes smaller than a light flux diameter of light in the light source 61. Light transmitted through the illumination aperture stop 64 is incident on a beam splitter 68 via the relay lens 67. The beam splitter 68 is a polarization beam splitter, for example. The beam splitter 68 allows P-polarized light parallel to the Y-axis direction to pass therethrough, and reflects S-polarized light parallel to the X-axis direction. Light transmitted through the beam splitter 68 is transmitted through a quarter-wavelength plate 70 via an aperture stop 69 and is converted into circularly-polarized light, and used for Kohler illumination of the pattern 72 provided on the substrate 73, via the objective optical system 71.

The illumination optical system 63 may include a light amount adjustment unit (not illustrated) that can switch a plurality of ND filters having different transmissivities, for light from the light source 61. By controlling the light amount adjustment unit, the control unit 1100 can accurately adjust the intensity of light to be used for illuminating the substrate 73.

Light (second light) from the pattern 72 is transmitted through the quarter-wavelength plate 70 via the objective optical system 71, converted from circularly-polarized light into S-polarized light, and is incident on the aperture stop 69. Light from the pattern 72 includes light reflected, diffracted, or scattered by the pattern 72. A polarized state of light from the pattern 72 becomes circular polarization inverse to circularly-polarized light to be used for illuminating the pattern 72.

Thus, if a polarized state of light to be used for illuminating the pattern 72 is clockwise circular polarization, a polarized state of light from the pattern 72 becomes counterclockwise circular polarization. Light transmitted through the aperture stop 69 is reflected by the beam splitter 68, and is incident on the detection unit 75 via an image forming optical system (second optical system) 74.

In such a manner, in the measuring unit 150, the beam splitter 68 splits an optical path into an optical path of light to be used for illuminating the substrate 73, and an optical path of light from the substrate 73, and an image of the pattern 72 is formed on the detection unit 75. The control unit 1100 acquires positions of pattern elements included in the pattern 72, and the position of the pattern 72 based on position information for the substrate stage WS that is obtained by the laser interferometer 81, and a waveform of a detected signal that is obtained by detecting an image of the pattern 72.

The measuring unit 150 may further include a detection aperture stop formed by arrangement of a plurality of lenses between the beam splitter 68 and the detection unit 75. The illumination aperture stop 64 and the detection aperture stop may respectively include a plurality of aperture stops having different numerical apertures settable for the illumination system and the detection system, and the plurality of aperture stops may be made switchable. With this configuration, it becomes possible to adjust a a value which is a coefficient indicating a ratio between a numerical aperture of the illumination system and a numerical aperture of the detection system.

Figure 11A:
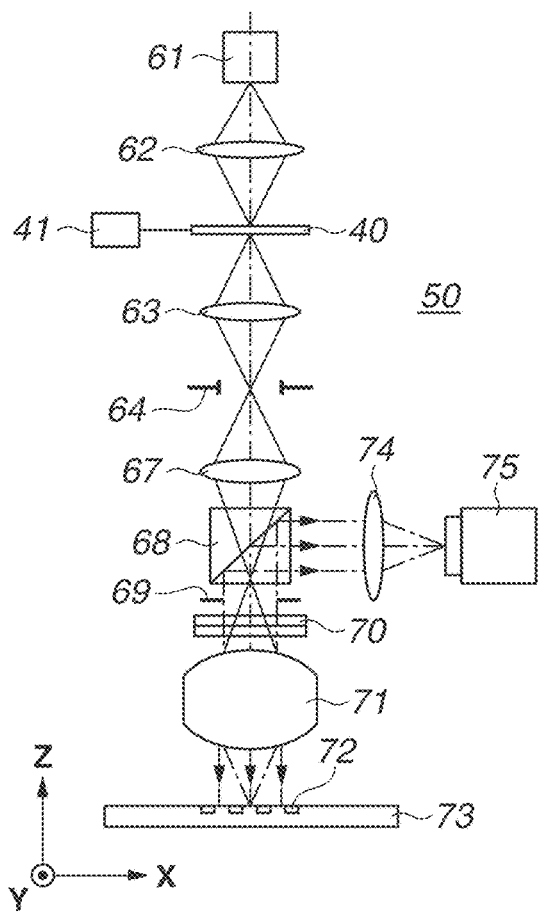
FIGS. 11A, 11B, 11C, 11D, and 11E are diagrams illustrating a measuring device according to a typical technique.
Figure 11B:
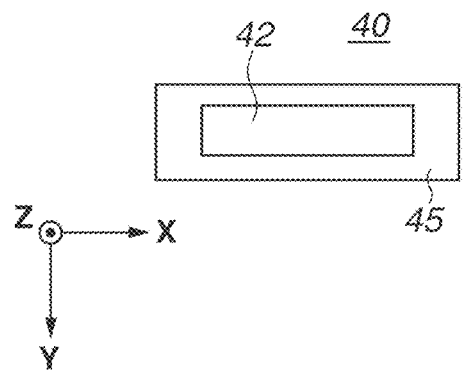

A measuring unit according to a typical technique will be described with reference to FIGS. 11A, 11B, 11C, 11D, and 11E. FIG. 11A is a diagram illustrating a configuration of a measuring unit 50 according to the typical technique. The other components of the measuring unit 50 are similar to the components of the measuring unit 150 illustrated in FIG. 1A, and thus, descriptions thereof will be omitted. FIG. 11B is a diagram illustrating a configuration example of a wavelength variable unit 40 according to the typical technique. The wavelength variable unit 40 includes a wavelength variable member 42 and a holding member 45. The wavelength variable member 42 is an optical element similar to the wavelength variable member 142 illustrated in FIG. 1C. The holding member 45 holds the wavelength variable member 42. The wavelength variable unit 40 is driven in the X-axis direction by the drive unit 41. By the wavelength variable unit 40 being moved based on a preliminarily-acquired relationship between a position and a wavelength of the wavelength variable unit 40, the substrate 73 can be illuminated with light having a desired wavelength.

In such a manner, the wavelength variable unit 40 is driven based on the preliminarily-acquired relationship between the position and the wavelength of the wavelength variable unit 40. Nevertheless, in a case where an incident position at which light is incident on the wavelength variable member 42 (hereinafter, will be referred to as an incident position), and/or a light flux diameter and/or an angular characteristic of incident light varies, a wavelength of light to be transmitted through the wavelength variable member 42 varies. Thus, a wavelength of light transmitted through the wavelength variable member 42 to be used for illuminating the substrate 73 might shift from a target wavelength (hereinafter, such a shift will be referred to as a wavelength shift).

Figure 11C:
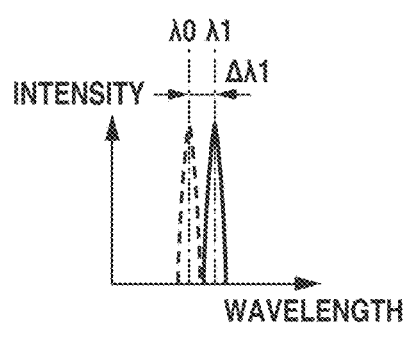

The occurrence factor of the wavelength shift will be described with reference to FIGS. 11C to 11E. FIG. 11C is a diagram illustrating a variation in wavelength of light transmitted through the wavelength variable member 42 in a case where an incident position varies in the X-axis direction. Factors causing an incident position to vary in the X-axis direction include a variation in the X-axis direction of a light emission point or an attached position of the light source 61, and the generation of a control error in position control of the wavelength variable member 42 that is performed by driving the drive unit 41. As illustrated in FIG. 11C, in a case where an incident position varies in the X-axis direction, a center wavelength of light transmitted through the wavelength variable member 42 varies from a wavelength $\lambda 0$ to a wavelength $\lambda 1$, and a shift $\Delta\lambda 1$ is generated in the center wavelength.

Figure 11D:
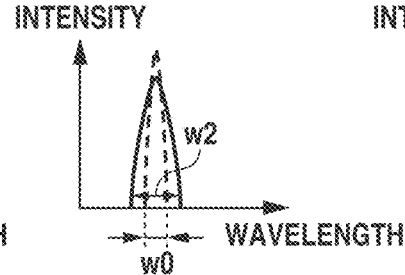

FIG. 11D is a diagram illustrating a variation in wavelength of light transmitted through the wavelength variable member 42 in a case where a light flux diameter of light incident on the wavelength variable member 42 varies. Factors causing a variation in a light flux diameter of light incident on the wavelength variable member 42 include a variation of a light emission point and/or an attached position of the light source 61 in the Z-axis direction, and a variation of an attached position of the illumination optical system 62, the illumination optical system 63, or the wavelength variable unit 40 in the Z-axis direction. As illustrated in FIG. 11D, in a case where a light flux diameter of light incident on the wavelength variable member 42 varies, a wavelength band of light which is transmitted through the wavelength variable member 42 varies from a wavelength band w0 to a wavelength band w2. A signal intensity varies in accordance with a variation in wavelength band, and in a case where a wavelength band widens, a signal intensity near the center wavelength decreases.

Figure 11E:
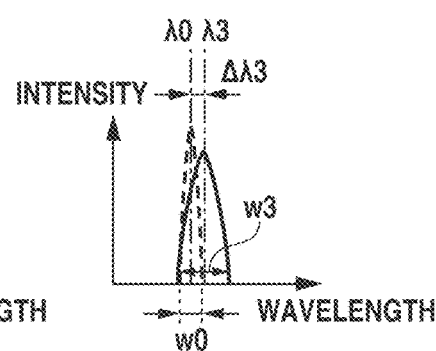

FIG. 11E is a diagram illustrating a variation in wavelength of light transmitted through the wavelength variable member 42 in a case where an angular characteristic of light incident on the wavelength variable member 42 varies. Factors causing a variation in angular characteristic of light incident on the wavelength variable member 42 include a variation in angle of light emitted from a light emission point of the light source 61, a variation in light intensity distribution with respect to an angle of light, and a variation in transmission characteristic of the illumination optical system 62 or the wavelength variable member 42. As illustrated in FIG. 11E, in a case where an angular characteristic of light incident on the wavelength variable member 42 varies, a center wavelength of light transmitted through the wavelength variable member 42 varies from a wavelength $\lambda 0$ to a wavelength $\lambda 3$, a shift $\Delta\lambda 3$ occurs in the center wavelength, and a wavelength band of light to be transmitted through the wavelength variable member 42 varies from a wavelength band w0 to a wavelength band w3. A signal intensity varies in accordance with a variation in wavelength band, and in a case where a wavelength band widens, a signal intensity near the center wavelength decreases. In a case where an incident position varies in the X-axis direction and an angular characteristic of light incident on the wavelength variable member 42 varies, a wavelength varies as illustrated in FIG. 11E as well.

In such a manner, in the measuring unit 50 according to the typical technique, a wavelength shift of light which is transmitted through the wavelength variable member 42 may lead to the occurrence of a shift in a wavelength of light to be used for illuminating the substrate 73. Thus, a decrease in intensity or an increase in error of a detected signal of light to be acquired by the detection unit 75 occurs, and the position measurement accuracy of a pattern can decline.

Figure 2A:
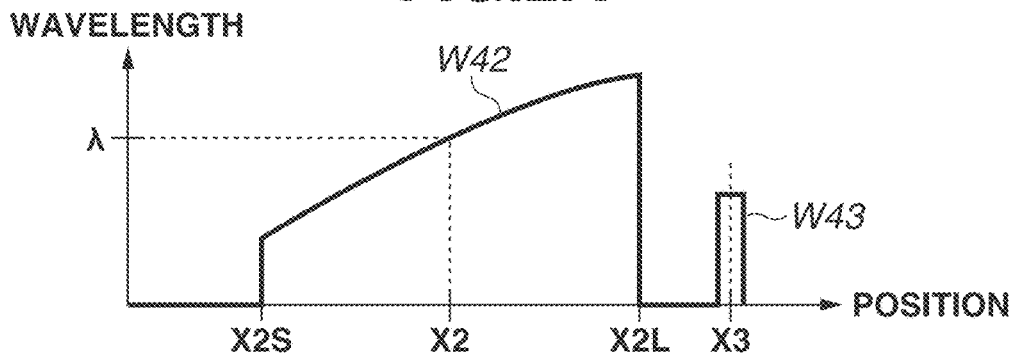
FIGS. 2A, 2B, and 2C are diagrams illustrating a measuring method according to the first exemplary embodiment.
Figure 2B:
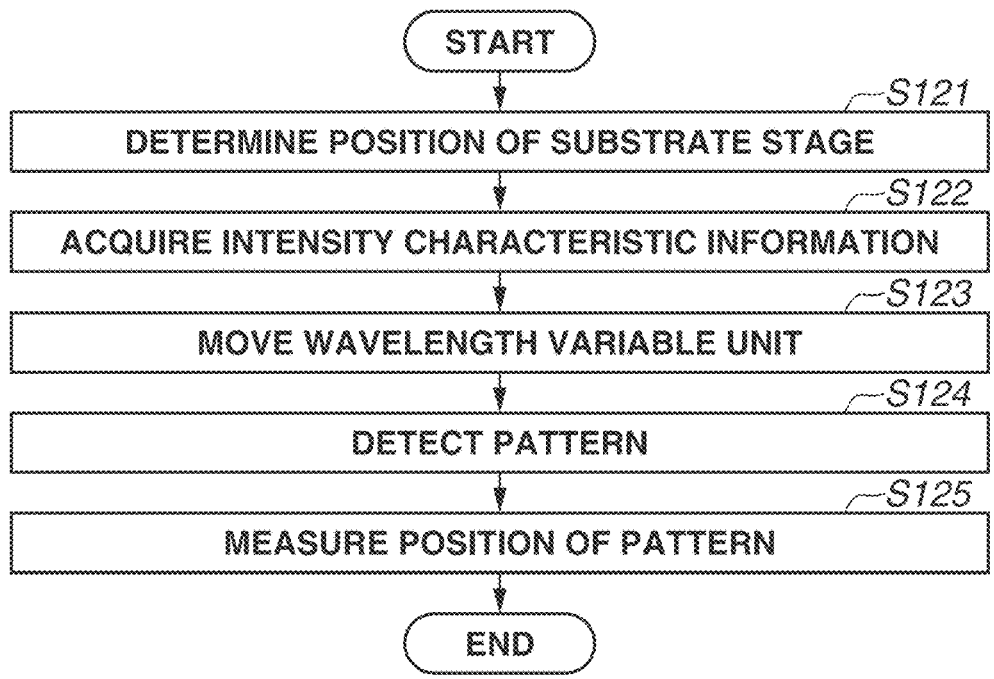
Figure 2C:
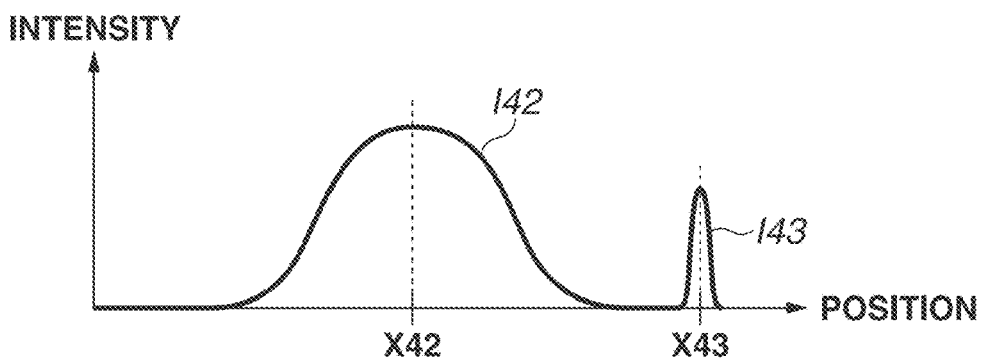

In view of the foregoing, the measuring device 100 according to the present exemplary embodiment determines the position of the wavelength variable unit 140 to be driven by the drive unit 41, using a relative distance between a light incident position in the wavelength variable member 142 and the opening 143 that is acquired from wavelength characteristic information for light to be transmitted through the wavelength variable member 142 and the opening 143 (hereinafter, such a relative distance will be simply referred to as a relative distance). FIGS. 2A, 2B, and 2C are diagrams illustrating a measuring method according to the present exemplary embodiment.

Before measuring a position of a pattern, the control unit 1100 acquires information indicating a relationship between a position of the wavelength variable unit 140 in the X-axis direction and a wavelength of light which is transmitted through the wavelength variable member 142 and the opening 143 (hereinafter, such information will be referred to as wavelength characteristic information). The wavelength characteristic information can be acquired from a storage unit of the control unit 1100 or an external apparatus. The wavelength characteristic information is acquired by measuring a wavelength of light while the position of the wavelength variable unit 140 in the X-axis direction is being actually varied.

The wavelength characteristic information may be acquired through simulation based on positions and dimensions of the wavelength variable member 142 and the opening 143, and a designed value of a wavelength characteristic of the wavelength variable member 142.

The wavelength characteristic information of the wavelength variable unit 140 will now be described. FIG. 2A is a diagram illustrating an example of wavelength characteristic information for the wavelength variable unit 140. In a graph illustrated in FIG. 2A, a horizontal axis indicates a position of the wavelength variable unit 140 in the X-axis direction, and a vertical axis indicates a wavelength (e.g., center wavelength) of light detected by the detection unit 75. A waveform W43 indicates a variation in a wavelength (second wavelength) of light transmitted through the opening 143, and a waveform W42 indicates a variation in a wavelength (first wavelength) of light transmitted through the wavelength variable member 142. In the graph illustrated in FIG. 2A, a range from positions X2S to X2L includes positions, in the X-axis direction, of the wavelength variable unit 140 at which light is incident on the wavelength variable member 142.

As illustrated in FIG. 2A, the opening 143 does not affect a wavelength of light which is transmitted, so that the waveform W43 indicating a variation in a wavelength of light which is transmitted through the opening 143 becomes constant irrespective of the position of the wavelength variable unit 140 in the X-axis direction. By obtaining positions at both ends of the waveform W43 in the X-axis direction, a center position λ3 of the opening 143 is acquired. In contrast, due to a wavelength characteristic of the wavelength variable member 142, the waveform W42 indicating a variation in a wavelength of light which is transmitted through the wavelength variable member 142 varies in accordance with the position of the wavelength variable unit 140 in the X-axis direction. In the example illustrated in FIG. 2A, the wavelength variable member 142 is arranged in such a manner that a wavelength of light to be transmitted through the wavelength variable member 142 increases as the position of the wavelength variable unit 140 in the X-axis direction increases. The configuration is not limited to the example illustrated in FIG. 2A. The wavelength variable member 142 may be arranged in such a manner that a wavelength of light to be transmitted through the wavelength variable member 142 decreases as the position of the wavelength variable unit 140 in the X-axis direction increases.

The control unit 1100 acquires a relative distance between a light incident position in the wavelength variable member 142 and the opening 143 based on the acquired wavelength characteristic information. In a case where the position of the wavelength variable unit 140 in the X-axis direction at which a wavelength of light to be transmitted through the wavelength variable member 142 becomes a wavelength λ, is denoted by λ2, a relative distance dX is represented by the following formula (1):

$$dX = X3 - X2 \quad (1).$$

The position X2 of the wavelength variable unit 140 in the X-axis direction at which a wavelength of light to be transmitted through the wavelength variable member 142 becomes the wavelength λ, is obtained based on the acquired wavelength characteristic information.

It is desirable that an interval in the X-axis direction between the wavelength variable member 142 and the opening 143 be set such that the interval is sufficiently large compared with a light flux diameter of light incident on the wavelength variable member 142. This configuration is provided in order to prevent overlap between the waveform W42 indicating a variation in center wavelength of light to be transmitted through the wavelength variable member 142, and the waveform W43 indicating a variation in center wavelength of light to be transmitted through the opening 143.

Next, a measuring method according to the present exemplary embodiment for measuring a position of a pattern will be described. FIG. 2B is a flowchart illustrating a measuring method of measuring a position of a pattern. FIG. 2B illustrates, as an example, a flowchart of a measuring method of measuring an overlay error, in other words, a relative position between a plurality of patterns included in the pattern 72.

In step S121, the control unit 1100 determines a position of the substrate stage WS. Initially, the control unit 1100 moves the substrate stage WS in direction (X-axis and Y-axis directions) vertical to the optical axis direction, to a position at which an image of the pattern 72 is formed in a detection region of the detection unit 75, and determines positions, in the X-axis and Y-axis directions, of the substrate stage WS. While moving the substrate stage WS in the optical axis direction (Z-axis direction), the control unit 1100 acquires the intensity of a detected signal acquired by the detection unit 75 detecting light from the pattern 72. The control unit 1100 moves the substrate stage WS in the Z-axis direction to a position at which a variation in intensity of a detected signal corresponding to the intensity of the acquired detected signal and a position in the optical axis direction becomes a threshold value or more, and determines a position of the substrate stage WS in the Z-axis direction.

In step S122, the control unit 1100 moves the wavelength variable unit 140 in the X-axis direction by a predetermined movement amount using the drive unit 41. The control unit 1100 causes the detection unit 75 to detect the intensity of light transmitted through the wavelength variable member 142 and the opening 143. The control unit 1100 controls the drive unit 41 and the detection unit 75 to repeatedly perform the movement of the wavelength variable unit 140 and the detection of light intensity.

While controlling the drive unit 41 and the detection unit 75, the control unit 1100 acquires a position of the wavelength variable unit 140 at which light intensity is detected by the detection unit 75.

The control unit 1100 thus acquires information indicating a relationship between the position, in the X-axis direction, of the wavelength variable unit 140 moved using the drive unit 41, and an intensity of light transmitted through the wavelength variable member 142 and the opening 143 (hereinafter, such information will be referred to as intensity characteristic information). The predetermined movement amount by which the wavelength variable unit 140 is moved using the drive unit 41 is not always the same movement amount. For example, in order to shorten a detection time, the control unit 1100 may move the wavelength variable unit 140 by a movement amount varying depending on the position of the wavelength variable unit 140 in the X-axis direction. For example, in a case where a position at which light is incident on the wavelength variable unit 140 corresponds to positions of the opening 143 and the wavelength variable member 142, a movement amount may be decreased, and in a case where the incident position corresponds to a position other than the positions of the opening 143 and the wavelength variable member 142, a movement amount may be increased.

The intensity characteristic information will be described. FIG. 2C is a diagram illustrating an example of intensity characteristic information of the wavelength variable unit 140. In a graph illustrated in FIG. 2C, a horizontal axis indicates the position of the wavelength variable unit 140 in the X-axis direction, and a vertical axis indicates the intensity of light detected by the detection unit 75. A waveform 143 indicates a variation in intensity of light transmitted through the opening 143, and a waveform 142 indicates a variation in intensity of light transmitted through the wavelength variable member 142. Positions at which the intensities become the largest in the waveforms 142 and 143 are denoted by X42 and X43, respectively.

In step S122, the control unit 1100 determines a position X of the wavelength variable unit 140 in the X-axis direction based on the relative distance and the intensity characteristic information for light transmitted through the opening 143. Next, a method of determining the position X of the wavelength variable unit 140 in the X-axis direction will be described. In the case of determining the position of the wavelength variable unit 140, a position at which the intensity becomes the largest is presumably determined based on the intensity characteristic information as illustrated in FIG. 2C. In other words, the position X can be set in such a manner that the position X42 at which the intensity becomes the largest in the waveform 142 illustrated in FIG. 2C corresponds to the position of the wavelength variable unit 140 in the X-axis direction. The position X42 at which the intensity becomes the largest in the waveform 142 is calculated by obtaining a centroid position by setting a slice level, for example. Nevertheless, as illustrated in FIG. 2C, in a case where a variation amount of the intensity is small near a peak of the waveform 142, it can become difficult to accurately calculate the position X42 in the X-axis direction at which the intensity becomes the largest.

In view of the foregoing, in the present exemplary embodiment, based on the relative distance dX and the position X43 obtained based on the intensity characteristic information, the position X at which a wavelength of light to be transmitted through the wavelength variable member 142 becomes a wavelength of light to be used for measurement is obtained. The position X43 at which the intensity becomes the largest in the waveform 143 is calculated through calculation of a centroid position by setting a slice level, for example. As illustrated in FIG. 2C, a variation amount of the intensity near the peak of the waveform 143 is larger than a variation amount of the intensity near the peak of in the waveform 142, so that it is possible to calculate the position X43 of the waveform 143 more accurately.

In a case where a wavelength of light to be used for measurement is denoted by λ, the control unit 1100 acquires a relative distance based on the waveform characteristic information. The control unit 1100 acquires the position X of the wavelength variable unit 140 in the X-axis direction based on the relative distance and the position X43 at which the intensity becomes the largest in the waveform 143. The position of the wavelength variable unit 140 in the X-axis direction at which the intensity becomes the largest in the waveform 143 is denoted by the position X43. A relative distance from the opening 143 at which a wavelength of light to be transmitted through the wavelength variable member 142 becomes the wavelength λ, is denoted by the relative distance dX. The position X of the wavelength variable unit 140 in the X-axis direction is represented by the following formula (2):

$$X = X43 - dX \quad (2).$$

In this manner, the control unit 1100 determines the position X of the wavelength variable unit 140 in the X-axis direction, at which a wavelength of light to be used for measurement becomes the wavelength k, based on the relative distance and the intensity characteristic information for light transmitted through the opening 143.

The control unit 1100 may set a measurement condition other than a wavelength of light to be used for measurement based on the intensity characteristic information acquired in step S122. The measurement condition other than a wavelength of light to be used for measurement includes a σ value and polarization of light, for example. By appropriately setting the measurement condition, it is possible to accurately measure the position of a pattern provided on the substrate 73.

Returning back to FIG. 2B, in step S123, the control unit 1100 moves the wavelength variable unit 140 using the drive unit 41 in such a manner that the position of the wavelength variable unit 140 in the X-axis direction becomes the determined position X. Thus, the wavelength of light transmitted through the wavelength variable member 142 becomes the wavelength k, and the light is emitted onto the substrate 73. The control unit 1100 can determine a position to which the wavelength variable unit 140 is to be moved from the position X of the wavelength variable unit 140 in the X-axis direction based on the position of the wavelength variable unit 140 at which the intensity of light is detected by the detection unit 75, which has been acquired in step S122.

In step S124, the control unit 1100 causes the measuring unit 150 to detect the pattern 72. The pattern 72 provided on the substrate 73 is illuminated with light emitted from the light source 61, and an image of the pattern 72 is acquired by an image sensor. Thus, a detected signal is acquired (detected) based on the obtained captured image.

In step S125, the control unit 1100 measures the position of the pattern 72 based on the detected signal of the pattern 72. For example, in the case of measuring an overlay error of a plurality of patterns 72 provided in different layers on the substrate 73, the control unit 1100 calculates measurement values of the positions of the patterns based on the detected signals of the patterns 72 provided in the respective layers on the substrate 73. The control unit 1100 then acquires a relative position which is a difference between these measurement values, as an overlay error.

In the present exemplary embodiment, a description has been provided of a configuration in which the measuring unit 150 includes one wavelength variable unit 140 and one drive unit 41, but the configuration is not limited to such a configuration. For example, the measuring unit 150 may have a configuration including a plurality of wavelength variable units and a plurality of drive units. For example, the measuring unit 150 may have a configuration including a first wavelength variable unit including a wavelength cut filter for cutting light with a wavelength longer than a first wavelength, and a second wavelength variable unit including a wavelength cut filter for cutting light with a wavelength shorter than a second wavelength. In such a case, the first wavelength variable unit and the second wavelength variable unit are arranged at positions conjugate with a light emission point of the light source 61. With this configuration, the control unit 1100 can emit light with a desired center wavelength and a desired wavelength band to the substrate 73 by controlling the positions of the first wavelength variable unit and the second wavelength variable unit.

As described above, the measuring device according to the present exemplary embodiment determines the position of a wavelength variable unit based on a relative distance between a wavelength variable member and an opening, and intensity characteristic information for light transmitted through the opening, so that a wavelength shift of light to be emitted onto a substrate can be reduced. Illuminating the substrate with light having a desired wavelength increases the intensity of a detected signal of light, thus reducing error of the detected signal.

Figure 3A:
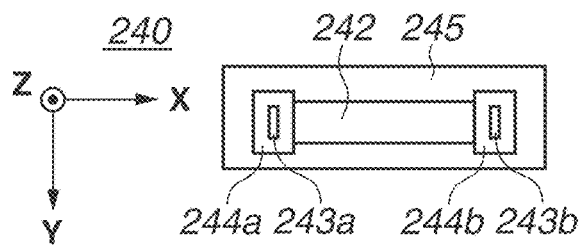
FIGS. 3A, 3B, 3C, 3D, and 3E are diagrams illustrating a measuring device and a measuring method according to a second exemplary embodiment.

A second exemplary embodiment of the present invention will be described. A measuring device according to the present exemplary embodiment will now be described. Matters not mentioned in the present exemplary embodiment can conform to those in the first exemplary embodiment. In the present exemplary embodiment, a configuration in which a wavelength variable unit including a plurality of openings is adopted will be described. FIGS. 3A, 3B, 3C, 3D, and 3E are diagrams illustrating a measuring device and a measuring method according to the present exemplary embodiment. FIG. 3A is a diagram illustrating a wavelength variable unit 240. The wavelength variable unit 240 includes a wavelength variable member 242, a first opening forming member 244a, a second opening forming member 244b, and a holding member 245. The first opening forming member 244a and the second opening forming member 244b respectively include a first opening 243a and a second opening 243b which allows incident light to pass therethrough, and are arranged at different positions in the X-axis direction with respect to the wavelength variable member 242. In the example illustrated in FIG. 3A, the first opening forming member 244a and the second opening forming member 244b are arranged near both ends of the wavelength variable member 242. The first opening 243a and the second opening 243b are arranged in the same plane (XY plane) as the wavelength variable member 242, which is vertical to an optical axis. Lengths in the longer side direction (X-axis direction) and shapes of the first opening 243a and the second opening 243b are similar to those of the opening 143 illustrated in FIG. 1C.

The first opening forming member 244a and the second opening forming member 244b block light incident on peripheral regions of the first opening 243a and the second opening 243b that include regions between the first opening 243a and the second opening 243b, and the wavelength variable member 242. The holding member 245 holds the wavelength variable member 242, the first opening forming member 244a, and the second opening forming member 244b.

Figure 3B:
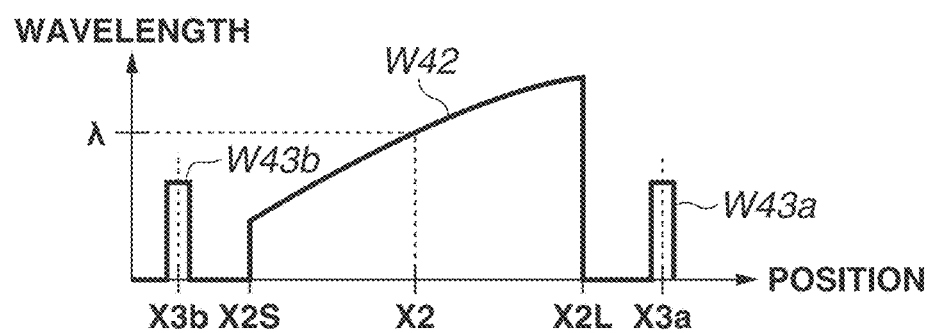

FIG. 3B is a diagram illustrating an example of wavelength characteristic information for the wavelength variable unit 240. A method of acquiring wavelength characteristic information for the wavelength variable unit 240 is similar to the method of acquiring the wavelength characteristic information for the wavelength variable unit 140 according to the first exemplary embodiment. In a graph illustrated in FIG. 3B, a horizontal axis indicates a position of the wavelength variable unit 240 in the X-axis direction, and a vertical axis indicates a wavelength (e.g., center wavelength) of light detected by the detection unit 75. Waveforms W43a and W43b respectively indicate variations in wavelengths of light transmitted through the first opening 243a and the second opening 243b, respectively, and a waveform W42 indicates a variation in wavelength of light transmitted through the wavelength variable member 242. Positions X3a and X3b indicate center positions of the first opening 243a and the second opening 243b, respectively.

Figure 3C:
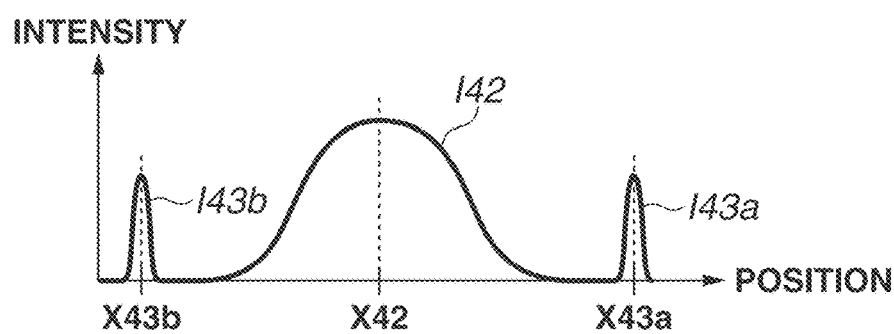

FIG. 3C is a diagram illustrating an example of intensity characteristic information for the wavelength variable unit 240. In a graph illustrated in FIG. 3C, a horizontal axis indicates a position of the wavelength variable unit 240 in the X-axis direction, and a vertical axis indicates an intensity of light detected by the detection unit 75. Waveforms I43a and I43b indicate variations in intensities of light transmitted through the first opening 243a and the second opening 243b, respectively, and a waveform 142 indicate a variation in intensity of light transmitted through the wavelength variable member 242. Positions at which intensities become the largest in the waveforms 142, I43a, and I43b are denoted by X42, X43a, and X43b, respectively.

In the present exemplary embodiment, the control unit 1100 acquires a first relative distance between a light incident position in the wavelength variable unit 240 and the first opening 243a at which a wavelength of light to be transmitted through the wavelength variable member 242 becomes the wavelength $\lambda$. The control unit 1100 further acquires a second relative distance between a light incident position in the wavelength variable member 242 and the second opening 243b at which a wavelength of light to be transmitted through the wavelength variable member 242 becomes the wavelength $\lambda$. In a case where a position of the wavelength variable unit 240 in the X-axis direction at which a wavelength of light to be transmitted through the wavelength variable member 242 becomes the wavelength $\lambda$ is denoted by $\lambda 2$, a first relative distance dXa and a second relative distance dXb are represented by the following formulae (3) and (4), respectively:

$$dXa = X3a - X2 \quad (3); \text{ and}$$

$$dXb = X3b - X2 \quad (4).$$

The control unit 1100 determines the position X of the wavelength variable unit 240 in the X-axis direction at which a wavelength of light to be used for measurement becomes the wavelength λ, based on relative position information including the first relative distance dXa and the second relative distance dXb, and intensity characteristic information of light transmitted through the first opening 243a and the second opening 243b. The position X of the wavelength variable unit 240 in the X-axis direction is represented by any of the following formulae (5) to (7):

$$X = X43a - dXa \quad (5);$$

$$X = X43b - dXb \quad (6); \text{ and}$$

$$X = \{(X43a - dXa) + (X43b - dXb)\}/2 \quad (7).$$

While the position X can be determined by using whichever of Formulae (5) and (6), selecting a formula in accordance with the original position of the wavelength variable unit 240 before driving shortens a time required for driving the wavelength variable unit 240. For Formula (7), determining the position X of the wavelength variable unit 240 in the X-axis direction based on an average value of relative positions between the wavelength variable member 242 and the first opening 243a and the second opening 243b enables further accurate determination of the position of the wavelength variable unit 240.

Figure 3D:
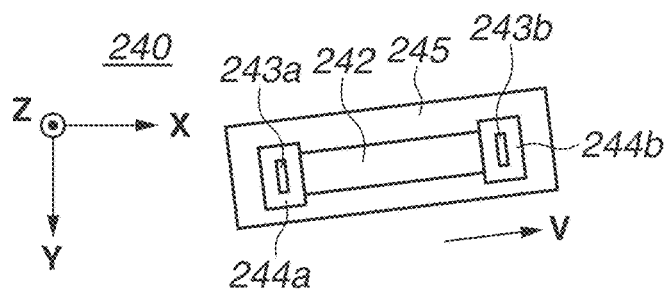

Use of the wavelength variable unit 240 enables correction of a shift between a drive direction of the drive unit 41 and a direction in which the wavelength variable unit 240 is arranged. FIG. 3D is a diagram illustrating an example in which a shift occurs between the drive direction (X-axis direction) of the drive unit 41 and the direction (V-axis direction) in which the wavelength variable unit 240 is arranged. Here, the V-axis direction is a direction along the XY plane, and is inclined at a predetermined angle with respect to the drive direction (X-axis direction) in which the wavelength variable unit 240 is driven by the drive unit 41.

Figure 3E:
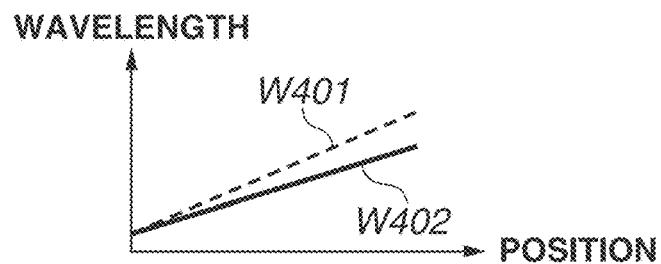

FIG. 3E is a diagram illustrating a relationship between a position of the wavelength variable unit 240 in the X-axis direction and a wavelength of light. In a case where the drive direction of the wavelength variable unit 240 is displaced from the V-axis direction to the X-axis direction, a wavelength varies from a wavelength W402 to a wavelength W401. In this manner, the occurrence of a shift in the drive direction of the wavelength variable unit 240 may lead to a shift of a wavelength of light to be transmitted through the wavelength variable member 242 from a desired wavelength, which may result in decline in measurement accuracy.

In view of the foregoing, the control unit 1100 obtains the position X of the wavelength variable unit 240 in the X-axis direction based on wavelength characteristic information of the wavelength variable unit 240 and intensity characteristic information for the wavelength variable unit 240, and determines the position of the wavelength variable unit 240. Here, the wavelength characteristic information for the wavelength variable unit 240 illustrated in FIG. 3B is preliminarily-acquired information, and indicates a variation in wavelength with respect to a position in the V-axis direction in FIG. 3D. The intensity characteristic information for the wavelength variable unit 240 illustrated in FIG. 3C is acquired by driving the wavelength variable unit 240 in the X-axis direction using the drive unit 41, and indicates a variation in intensity with respect to the position in the X-axis direction in FIG. 3D.

The control unit 1100 obtains a first distance (X3b–X3a) between the first opening 243a and the second opening 243b from the waveform characteristic information illustrated in FIG. 3B. The control unit 1100 further obtains a second distance (X43b–X43a) between the first opening 243a and the second opening 243b from the intensity characteristic information illustrated in FIG. 3C. The control unit 1100 then obtains the position X of the wavelength variable unit 240 in the X-axis direction based on the first distance obtained from the waveform characteristic information and the second distance obtained from the intensity characteristic information, and determines the position of the wavelength variable unit 240. A value obtained by dividing the second distance by the first distance is defined as a parameter α as in the following formula (8).

$$\alpha = (X43a - X43b)/(X3a - X3b) \quad (8)$$

The control unit 1100 then obtains, using the parameter α, the above-described first relative distance dXa and second relative distance dXb using the following formulae (9) and (10), respectively:

$$dXa = \alpha \times (X3a - X2) \quad (9); \text{ and}$$

$$dXb = \alpha \times (X3b - \lambda 2) \quad (10).$$

The control unit 1100 then obtains the position X of the wavelength variable unit 240 in the X-axis direction using any of the above-described formulae (5) to (7). The position X of the wavelength variable unit 240 in the X-axis direction is thereby obtained as a value obtained by correcting a shift between the drive direction of the drive unit 41 and the direction in which the wavelength variable unit 240 is arranged. The control unit 1100 determines the position of the wavelength variable unit 240 based on the corrected position X.

The parameter α is information indicating a degree of shift between the drive direction of the drive unit 41 and the direction in which the wavelength variable unit 240 is arranged. Thus, by determining whether the parameter α falls within a predefined allowable range, the control unit 1100 can determine whether the direction (drive direction) in which the wavelength variable unit 240 is driven by the drive unit 41 is normal. If the control unit 1100 determines that the drive direction is not normal (is abnormal), the control unit 1100 stops processing of measuring the pattern 72, and notify the user that the drive direction has been determined to be abnormal. If the user is notified that the drive direction has been determined to be abnormal, the user can correct a shift in the drive direction by adjusting the attached position of the wavelength variable unit 240 or a feed position brought by the drive unit 41.

As described above, the measuring device according to the present exemplary embodiment determines the position of a wavelength variable unit based on relative position information between a wavelength variable member and an opening, and intensity characteristic information for light transmitted through the opening, so that a wavelength shift of light to be emitted onto a substrate can be reduced. Use of a wavelength variable unit including a plurality of openings enables further accurate determination of the position of a wavelength variable unit. Illuminating the substrate with light having a desired wavelength increases the intensity of a detected signal of light, thus reducing an error of the detected signal.

Figure 4A:
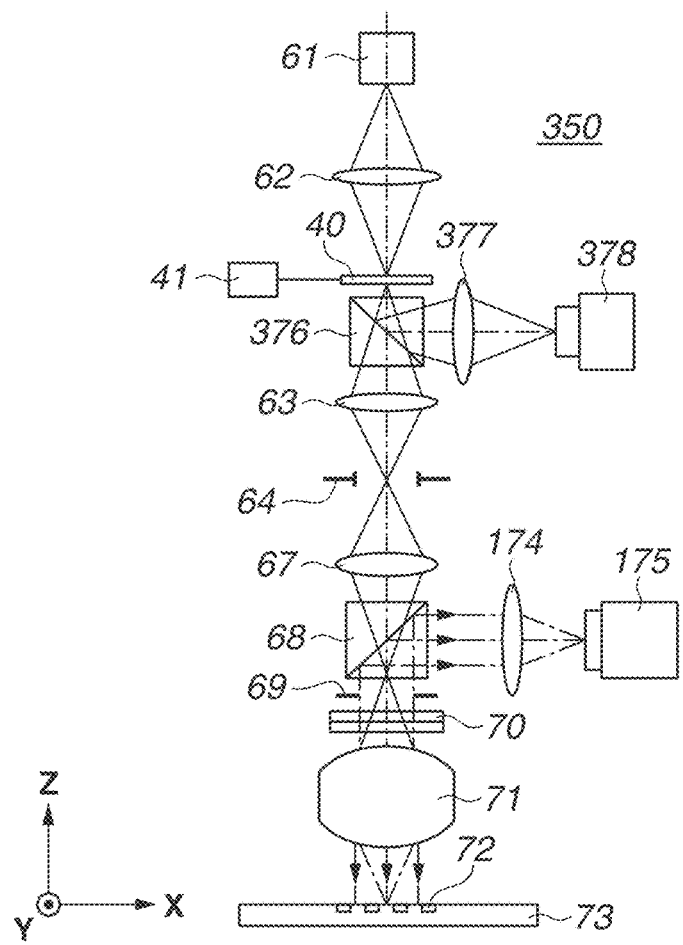
FIGS. 4A and 4B are diagrams illustrating a measuring device and a measuring method according to a third exemplary embodiment.
Figure 4B:
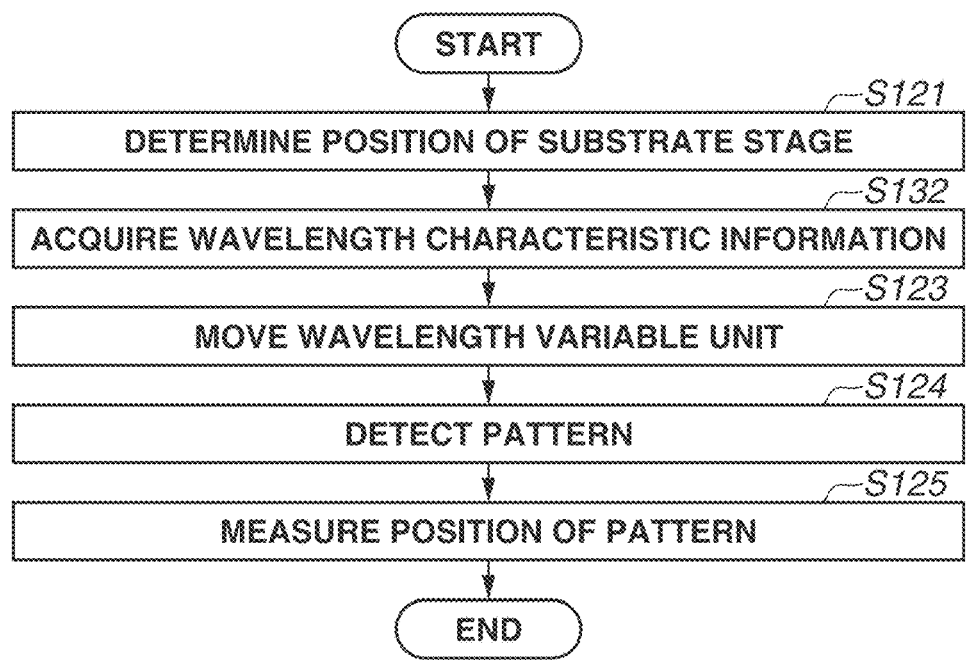

A third exemplary embodiment of the present invention will be described. A measuring device according to the present exemplary embodiment will now be described. Matters not mentioned in the present exemplary embodiment can conform to those in the first or second exemplary embodiment. In the present exemplary embodiment, a configuration in which a position of a wavelength variable unit is determined using a spectroscopic detection unit that detects a wavelength of light will be described. FIGS. 4A and 4B are diagrams illustrating a measuring device and a measuring method according to the present exemplary embodiment. FIG. 4A is a diagram illustrating a configuration of a measuring unit 350. The measuring unit 350 corresponds to the measuring unit 50 illustrated in FIG. 11A, and differs from the measuring unit 50 in that an optical branching unit 376, a lens 377, and a spectroscopic detection unit 378 are included. The other components of the measuring unit 350 are similar to those of the measuring unit 50, description thereof will be omitted.

The spectroscopic detection unit 378 receives part of light transmitted through the wavelength variable unit 40, via the optical branching unit 376 and the lens 377, and detects a wavelength of light. Light emitted from the light source 61 is transmitted through the wavelength variable unit 40 and branched by the optical branching unit 376, and part of the light is detected by the spectroscopic detection unit 378 via the lens 377. The optical branching unit 376 is a beam splitter that splits incident light into transmitted light and reflected light at a predetermined branching ratio, for example. The spectroscopic detection unit 378 includes a spectroscopic unit that disperses light by wavelength, and a detection unit that detects dispersed light. Incident light is dispersed by wavelength by the spectroscopic unit and then detected by the detection unit. The spectroscopic unit and the detection unit are a diffractive grating and an image sensor, respectively, for example.

A detection unit 175 may include a spectroscopic unit that disperses light by wavelength, and a detection unit that detects dispersed light, and be configured to also detect a wavelength of light. More specifically, the detection unit 175 may have a function of detecting a wavelength and an intensity of light, and the control unit 1100 may be configured to acquire a wavelength and an intensity of light based on a detection result obtained by the detection unit 175.

Next, a measuring method of measuring a position of a pattern, according to the present exemplary embodiment will be described. FIG. 4B is a flowchart illustrating a method of measuring a position of a pattern. A difference from the measuring method illustrated in FIG. 2B lies in step S132, and thus, descriptions of other steps will be omitted.

In step S132, the control unit 1100 moves the wavelength variable unit 40 in the X-axis direction by a minute distance using the drive unit 41. The control unit 1100 causes the spectroscopic detection unit 378 to detect a wavelength of light to be transmitted through the wavelength variable member 42. The control unit 1100 controls the drive unit 41 and the spectroscopic detection unit 378 to repeatedly perform the movement of the wavelength variable unit 40 and the detection of a light wavelength. Here, the spectroscopic detection unit 378 detects a wavelength of light by dispersing light using the spectroscopic unit. In other words, the spectroscopic detection unit 378 acquires wavelength information for light by detecting light dispersed by wavelength via the spectroscopic unit. Thus, the control unit 1100 acquires information indicating a relationship between a position, in the X-axis direction, of the wavelength variable unit 40 moved using the drive unit 41, and a wavelength of light which is transmitted through the wavelength variable member 42 (hereinafter, such information is referred to as wavelength characteristic information). The wavelength characteristic information acquired in the present exemplary embodiment has a waveform similar to the waveform W42, according to the first exemplary embodiment, which is illustrated in FIG. 2A.

The minute distance by which the wavelength variable unit 40 is moved is not limited to an equal distance. For example, in order to shorten a detection time, the control unit 1100 may move the wavelength variable unit 40 using the drive unit 41 by a distance which is different depending on the position in the X-axis direction. For example, in a case where the position of the wavelength variable unit 40 in the X-axis direction corresponds to the position in the wavelength variable member 42, the distance may be shortened, and in a case where the position of the wavelength variable unit 40 corresponds to a position other than the position in the wavelength variable member 42, the distance may be elongated.

In step S132, based on the acquired wavelength characteristic information, the control unit 1100 determines a position X of the wavelength variable unit 40 in the X-axis direction at which a wavelength of light to be used for measurement becomes the wavelength $\lambda$.

The processing of acquiring wavelength characteristic information needs not be always performed when the detection and measurement of a pattern are performed. For example, in a case where a wavelength of light to be used for measurement is not changed from the wavelength $\lambda$, the control unit 1100 may use the same position X as the position used last time without performing the processing of acquiring wavelength characteristic information. Further, the control unit 1100 may perform the processing of acquiring wavelength characteristic information in a case where an elapsed time since wavelength characteristic information has been acquired last time or the number of times measurement processing has been performed exceeds a threshold value. This can shorten a time required for the processing of measuring a pattern.

As described above, the measuring device according to the present exemplary embodiment determines the position of a wavelength variable unit based on wavelength characteristic information acquired in the measuring device, so that a wavelength shift of light to be emitted onto a substrate can be reduced. Illuminating the substrate with light having a desired wavelength increases the intensity of a detected signal of light, thus reducing an error of the detected signal.

A fourth exemplary embodiment of the present invention will be described below. A measuring device according to the present exemplary embodiment will now be described. Matters not mentioned in the present exemplary embodiment can conform to those in the first to third exemplary embodiments. In the present exemplary embodiment, a configuration in which a position of a wavelength variable unit is determined using a wavelength switching unit that switches a wavelength of light will be described. FIGS. 5A, 5B, and 5C are diagrams illustrating a measuring device and a measuring method according to the present exemplary embodiment. FIG. 5A is a diagram illustrating a configuration of a measuring unit 450. The measuring unit 450 corresponds to the measuring unit 50 illustrated in FIG. 11A, and differs from the measuring unit 50 in that a wavelength switching unit 430 is included. Because the other components of the measuring unit 450 are similar to those of the measuring unit 350, descriptions thereof will be omitted.

FIG. 5B is a diagram illustrating the wavelength switching unit 430 according to the present exemplary embodiment. The wavelength switching unit 430 includes a plurality of wavelength filters 431a to 431f and a holding member 435. The wavelength switching unit 430 causes light emitted from the light source 61, to be transmitted through any of a plurality of wavelength filters varying a wavelength of transmitted light to different wavelengths, and to be incident on the wavelength variable unit 40. The wavelength switching unit 430 can vary a wavelength of light which is allowed to be incident on the wavelength variable unit 40 by being driven by a drive unit (not illustrated) in a rotational direction (θZ) about the Z-axis to switch a wavelength filter to be arranged at a light incident position. The wavelength filters 431a to 431f vary a wavelength of transmitted light to different wavelengths, and vary a wavelength of transmitted light to a wavelength within a predetermined range in the surfaces of the respective wavelength filters.

Next, a measuring method according to the present exemplary embodiment for measuring a position of a pattern will be described. FIG. 5C is a flowchart illustrating a method of measuring a position of a pattern. Differences from the measuring methods illustrated in FIGS. 2B and 3B lie in steps S142 and S143, and thus, descriptions of other steps will be omitted.

In step S142, the control unit 1100 rotationally moves the wavelength switching unit 430 in the θZ direction using the drive unit (not illustrated), and positions the wavelength switching unit 430 in such a manner that any of a plurality of wavelength filters is arranged on an optical path. In a state in which the wavelength switching unit 430 is positioned, the control unit 1100 moves the wavelength variable unit 40 using the drive unit 41 in the X-axis direction by a minute distance. The control unit 1100 causes the detection unit 75 to detect the intensity of light transmitted through the wavelength switching unit 430 and the wavelength variable member 42. The control unit 1100 controls the drive unit 41 and the detection unit 75 to repeatedly perform the movement of the wavelength variable unit 40 and the detection of light intensity. While controlling the drive unit 41 and the detection unit 75, the control unit 1100 acquires the position of the wavelength variable unit 40 at which light intensity is detected by the detection unit 75.

Next, intensity characteristic information acquired in step S142 will be described with reference to FIGS. 6A, 6B, 6C, and 6D.

FIG. 6A is a diagram illustrating an example of a wavelength of light which is transmitted through any of a plurality of wavelength filters (e.g., wavelength filter 431b). In this example, a wavelength band of light which is transmitted through the wavelength filter 431b is assumed to range from a wavelength W23S to a wavelength W23L. FIG. 6B is a diagram illustrating an example of a wavelength of light which is transmitted through the wavelength variable member 42. In other words, the wavelength switching unit 430 functions as a wavelength restriction unit that restricts a wavelength band of light from a light source to a predetermined range. In this example, a wavelength band of light which is transmitted through the wavelength variable member 42 when light is incident at a predetermined position of the wavelength variable member 42 is assumed to range from a wavelength W24S to a wavelength W24L. At this time, the incident position of light incident on the wavelength variable member 42 is moved in the X-axis direction in the wavelength variable member 42 by the wavelength variable unit 40 being moved in the X-axis direction using the drive unit 41. Thus, the wavelength of the light transmitted through the wavelength variable member 42, which is illustrated in FIG. 6B, varies along with variations in positions of the wavelength W24S and the wavelength W24L in accordance with the position of the wavelength variable unit 40 in the X-axis direction.

FIG. 6C is a diagram illustrating an example of intensity characteristic information acquired in step S142. In a graph illustrated in FIG. 6C, a horizontal axis indicates a position of the wavelength variable unit 40 in the X-axis direction, and a vertical axis indicates an intensity of light detected by the detection unit 75. A waveform 1200 indicates a relationship between a position in the X-axis direction of the wavelength variable unit 40 and an intensity of light detected by the detection unit 75. In a case where light is incident at a position at which the wavelength W24L which is the largest value in a wavelength band of light which is transmitted through the wavelength variable member 42 becomes smaller than the wavelength W23S that is the smallest value in a wavelength band of light that is transmitted through the wavelength filter 431b, an intensity of light detected by the detection unit 75 becomes 0. Also in a case where light is incident at a position at which the wavelength W24S which is the smallest value in a wavelength band of light that is transmitted through the wavelength variable member 42 becomes larger than the wavelength W23L which is the largest value in a wavelength band of light that is transmitted through the wavelength filter 431b, an intensity of light detected by the detection unit 75 becomes 0. On the other hand, in a case where light is incident at a position at which a wavelength band of light that is transmitted through the wavelength variable member 42 at least partially overlaps a wavelength band of light that is transmitted through the wavelength filter 431b, an intensity of light detected by the detection unit 75 becomes 0 or more.

FIG. 6D is a diagram illustrating an example of a differential value of a light intensity with respect to the position of a wavelength variable unit. In a graph illustrated in FIG. 6D, a horizontal axis indicates a position of the wavelength variable unit 40 in the X-axis direction, and a vertical axis indicates a differential value of a light intensity (waveform 1200) with respect to the position of the wavelength variable unit 40 in the X-axis direction. A waveform 1201 indicates a relationship between the position of the wavelength variable unit 40 in the X-axis direction and the differential value of an intensity of light detected by the detection unit 75. The waveform 1201 has two peaks at positions at which the waveform 1200 varies. Positions of the two peaks are denoted by X20S and X20L.

In the waveform 1200 illustrated in FIG. 6C, a variation from 0 to the largest value and a variation from the largest value to 0 are steeper as compared with those in the waveform 142 illustrated in FIGS. 2C and 3C.

In other words, it becomes possible to accurately obtain the positions X20S and X20L of the peaks of the waveform 1201 illustrated in FIG. 6D. This is because a wavelength band of light incident on the wavelength variable unit 40 is restricted by the wavelength switching unit 430 to a fixed range.

Returning back to FIG. 5C, in step S143, the control unit 1100 determines whether to update the position of the wavelength variable unit 40. More specifically, the control unit 1100 acquires the positions X20S and X20L of the peaks of the waveform 1201, and determines whether variation amounts of the positions X20S and X20L are larger than a predetermined threshold value. If the control unit 1100 determines in step S143 that variation amounts of the positions X20S and X20L are larger than a predetermined threshold value (YES in step S143), the control unit 1100 advances the processing to step S144.

In step S144, the control unit 1100 corrects wavelength characteristic information based on the variation amounts of the positions X20S and X20L. The control unit 1100 determines a position X of the wavelength variable unit 40 in the X-axis direction based on the corrected wavelength characteristic information, and the control unit 1100 advances the processing to step S123.

If the control unit 1100 determines in step S143 that variation amounts of the positions X20S and X20L are smaller than a predetermined threshold value (NO in step S143), the control unit 1100 advances the processing to step S124.

The description has been provided of an example in which intensity characteristic information for light transmitted through the wavelength variable unit 40 is acquired using one wavelength filter, but an applicable scope of the present exemplary embodiment is not limited to this. For example, by acquiring a plurality of pieces of intensity characteristic information using a plurality of wavelength filters, and acquiring an average value of variation amounts of the positions X20S and X20L, it is possible to accurately obtain a corrected value of the position of the wavelength variable unit 40.

As described above, the measuring device according to the present exemplary embodiment determines a corrected value of a position of a wavelength variable unit based on intensity characteristic information acquired in the measuring device, thus reducing a wavelength shift of light to be emitted onto a substrate. Illuminating the substrate with light having a desired wavelength increases the intensity of a detected signal of light, thus reducing an error of the detected signal.

Figure 7A:
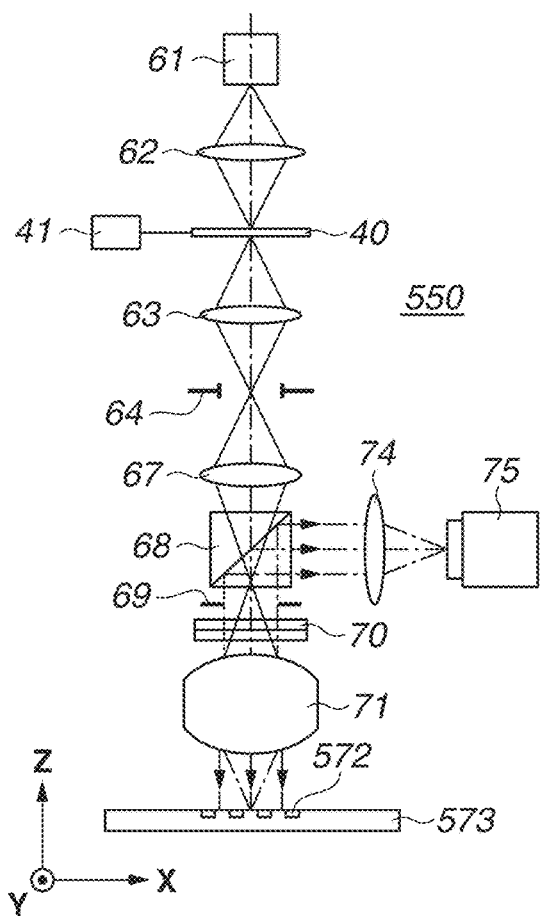
FIGS. 7A, 7B, 7C, 7D, and 7E are diagrams illustrating a measuring device and a measuring method according to a fifth exemplary embodiment.

A fifth exemplary embodiment of the present invention will be described below. A measuring device according to the present exemplary embodiment will now be described. Matters not mentioned in the present exemplary embodiment can conform to those in the first to fourth exemplary embodiments. In the present exemplary embodiment, a configuration in which wavelength characteristic information is corrected based on intensity characteristic information for light reflected by a substrate, and a position of the wavelength variable unit 40 in the X-axis direction is determined will be described. FIGS. 7A, 7B, 7C, 7D, and 7E are diagrams illustrating a measuring device and a measuring method according to the present exemplary embodiment. FIG. 7A is a diagram illustrating a configuration of a measuring unit 550. The measuring unit 550 corresponds to the measuring unit 50 illustrated in FIG. 11A, and has a configuration similar to that of the measuring unit 50. Thus, a description of the configuration of the measuring unit 550 will be omitted.

Figure 7B:
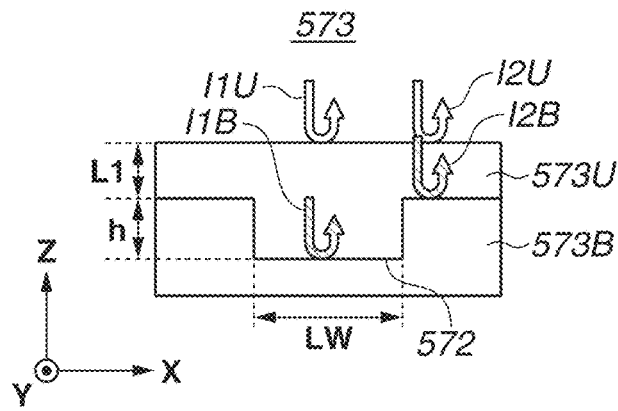

FIG. 7B is a diagram illustrating a substrate 573 used in the present exemplary embodiment, and light reflected by the substrate 573. The substrate 573 includes a first layer 573B, and a second layer 573U formed on the first layer 573B. A pattern 572 is provided in the first layer 573B of the substrate 573, and the pattern 572 is formed from a recessed portion. A width in the X-axis direction of the pattern 572 is denoted by LW, and a height of the pattern 572 from the bottom surface of the recessed portion to the top surface of the first layer 573B is denoted by h. A height from the top surface of the first layer 573B to the top surface of the second layer 573U is denoted by L1.

Among light rays incident on the substrate 573, a light ray incident on a region in which the pattern 572 is provided is denoted by I1, and a light ray incident on a region other than the region in which the pattern 572 is provided is denoted by I2. The light ray I1 becomes a reflected light ray in which a light ray I1B reflected by the bottom surface of the first layer 573B and a light ray I1U reflected by the top surface of the second layer 573U interfere with each other. The light ray I2 becomes a reflected light ray in which a light ray I2B reflected by the top surface of the first layer 573B and a light ray I2U reflected by the top surface of the second layer 573U interfere with each other.

Amplitudes of the light rays I1B, I1U, I2B, and I2U are respectively denoted by $A_{1B}$, $A_{1U}$, $A_{2B}$, and $A_{2U}$, and a phase difference between the reflected light rays I1B and I1U is denoted by $\varphi 1$, and a phase difference between the reflected light rays I2B and I2U is denoted by $\varphi 2$. Intensities i1 and i2 of the light rays I1 and I2 reflected by the substrate 573 are represented by the following formulae (11) and (12), respectively:

$$i1 = A_{1B}^2 + A_{1U}^2 + 2A_{1B}A_{1U}*\cos \varphi 1 \quad (11); \text{ and}$$

$$i2 = A_{2B}^2 + A_{2U}^2 + 2A_{2B}A_{2U}*\cos \varphi 2 \quad (12).$$

For example, when a refractive index $n_B$ of the first layer 573B and a refractive index $n_U$ of the second layer 573U satisfy a relationship represented by the following formula (13):

$$1 > n_U > n_B \quad (13).$$

In a case where a phase difference between the light rays I1B and I1U becomes an integral multiple of a wavelength, phases of the light rays I1B and I1U become coherent, the light rays I1B and I1U intensify each other, and an intensity of the light ray I1 detected by the detection unit 75 increases. By contrast, in a case where a phase difference between the light rays I1B and I1U becomes an integral multiple of a half wavelength, the light rays I1B and I1U weaken each other, and an intensity of the light ray I1 detected by the detection unit 75 decreases.

Figure 7C:
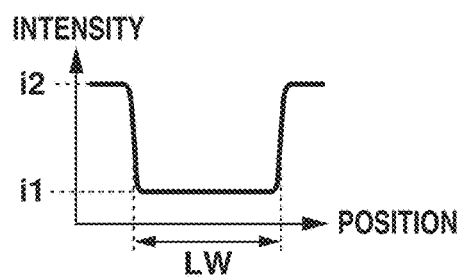

FIG. 7C is a diagram illustrating an example of intensities of the light rays I1 and I2 detected by the detection unit 75. FIG. 7C illustrates an example in which the light ray I1 is weaken due to interference in the light rays I1B and I1U, and the light ray I2 is intensified due to interference in the light rays I2B and I2U, so that the intensity i1 of the light ray I1 becomes smaller than the intensity i2 of the light ray I2.

Figure 7D:
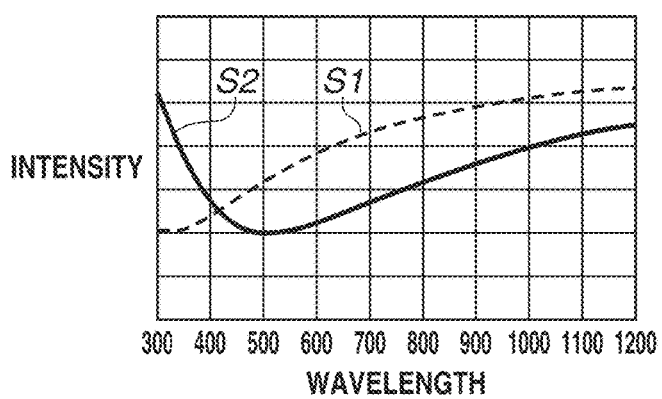

FIG. 7D illustrates variations in intensities of the light rays I1 and I2 in a case where a wavelength is varied by the wavelength variable unit 40 being driven using the drive unit 41. A horizontal axis indicates wavelengths of the light rays I1 and I2, and a vertical axis indicates intensities of the light rays I1 and I2. Waveforms S1 and S2 indicate variations in intensities of the light rays I1 and I2, respectively. A variation in light intensity that is caused by light interference varies in accordance with a phase difference and a wavelength of light. The phase differences $\varphi 1$ and $\varphi 2$ are respectively represented by the following formulae (14) and (15) using the heights h and L1 and the refractive index $n_U$ of the second layer 573U:

$$\varphi 1 = 2n_U(L1+h) \quad (14); \text{ and}$$

$$\varphi 2 = 2n_U h \quad (15).$$

Thus, if the light rays I1 and I2 are detected using a substrate having the identical heights h and L1 and the identical refractive index $n_U$ of the second layer 573U, the same variations in intensity as the variations indicated by the waveforms S1 and S2 illustrated in FIG. 7D can be detected. In a case where a wavelength is varied by the drive unit 41 driving the wavelength variable unit 40, with the occurrence of a wavelength shift, a shift occurs in the waveforms S1 and S2 in the horizontal axis direction.

In view of the foregoing, in the present exemplary embodiment, wavelength characteristic information is corrected based on preliminarily-acquired information indicating a relationship between a wavelength and a light intensity, and information regarding an intensity of light detected by the detection unit 75 by the drive unit 41 driving the wavelength variable unit 40, and a position of the wavelength variable unit 40 in the X-axis direction is determined.

More specifically, a variation amount in the horizontal axis direction of a waveform of an intensity of detected light with respect to the waveforms S1 and S2 in the preliminarily-acquired relationship between a wavelength and a light intensity is obtained, and wavelength characteristic information is corrected in accordance with the obtained variation amount. A position of the wavelength variable unit 40 in the X-axis direction is determined based on the corrected wavelength characteristic information. Wavelength characteristic information can be corrected based on either the waveform S1 or S2, but wavelength characteristic information can be corrected accurately by using two pieces of information.

In place of information indicating a relationship between a wavelength and a light intensity, information indicating a relationship between a wavelength and a contrast may be used. A contrast Cnt can be obtained as represented by the following formula (16) using the light intensities i1 and i2:

$$Cnt = (i2 - i1)/(i2 + i1) \qquad (16).$$

Figure 7E:
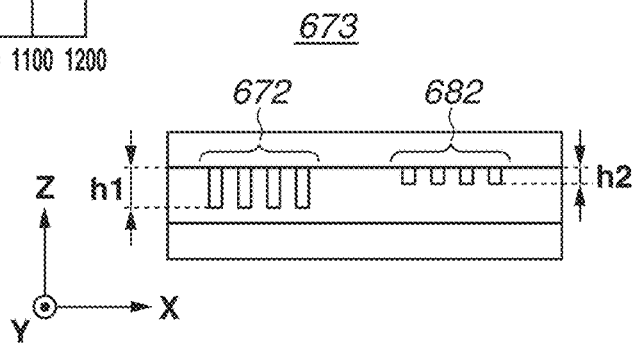

In place of the substrate 573 in which the pattern 572 is formed in the recessed portion, a substrate in which a plurality of patterns having different heights is formed may be used. FIG. 7E is a diagram illustrating a substrate 673 in which a pattern 672 (first pattern) and a pattern 682 (second pattern) having different heights are formed. When the height of the pattern 672 is denoted by h1 and the height of the pattern 682 is denoted by h2, the heights h1 and h2 are different from each other. In a case where light incident on the substrate 673 is reflected, phases of reflected light rays from the bottom surface of the pattern 672 and the pattern 682 vary in accordance with the height h1 of the pattern 672 and the height h2 of the pattern 682, and a difference occurs in a variation in light intensity with respect to a variation in wavelength. Thus, as in the case where the substrate 573 is used, wavelength characteristic information can be corrected and a position of the wavelength variable unit 40 in the X-axis direction can be determined.

As described above, the measuring device according to the present exemplary embodiment corrects wavelength characteristic information based on intensity characteristic information for light reflected by a substrate and determines a position of the wavelength variable unit 40 in the X-axis direction, a so that wavelength shift of light to be emitted onto a substrate can be reduced. Illuminating the substrate with light having a desired wavelength increases the intensity of a detected signal of light, thus reducing an error of the detected signal.

Figure 8:
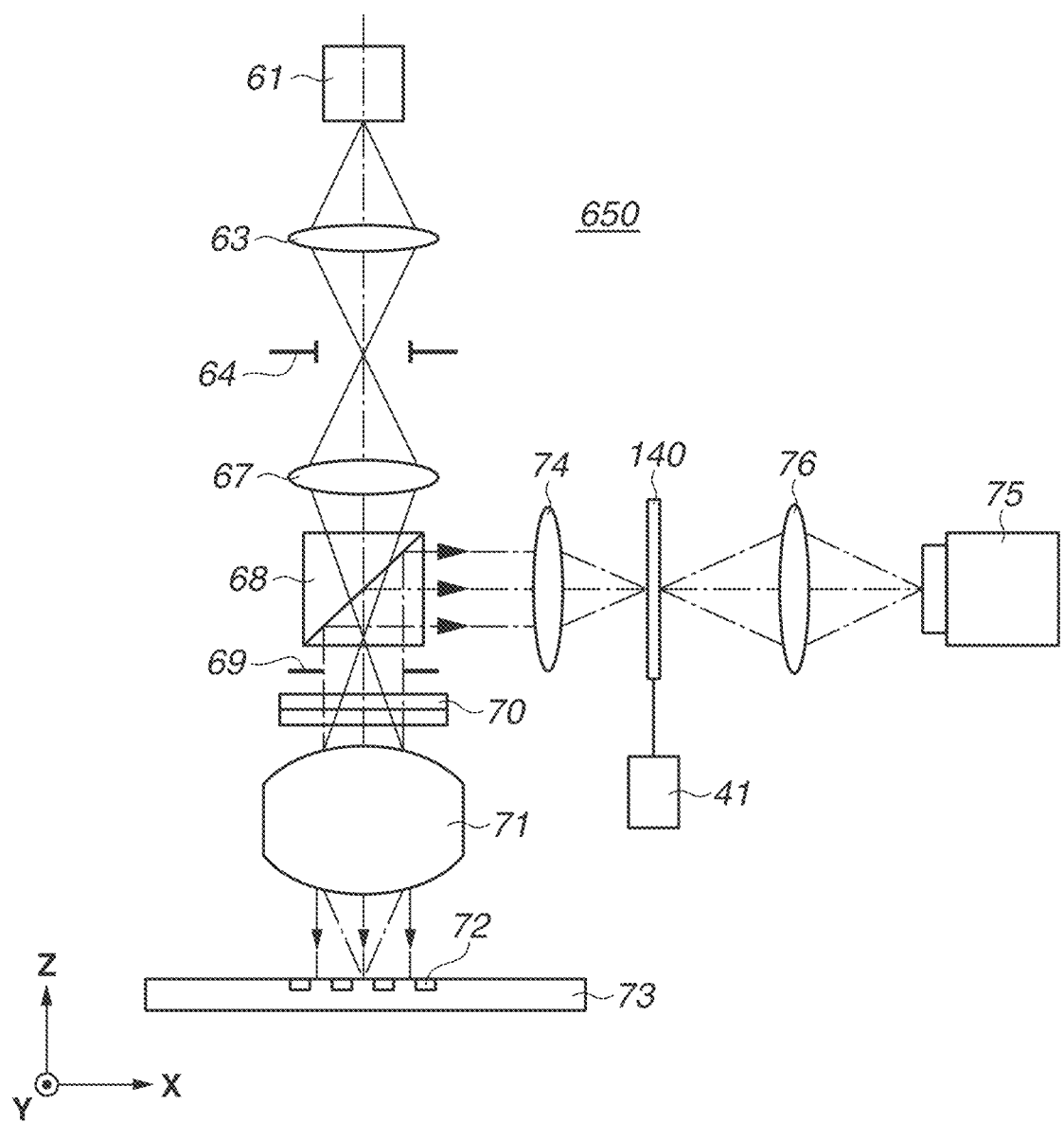
FIG. 8 is a diagram illustrating a measuring device according to a sixth exemplary embodiment.

A sixth exemplary embodiment of the present invention will be described. A measuring device according to the present exemplary embodiment will now be described. Matters not mentioned in the present exemplary embodiment can conform to those in the first to the fifth exemplary embodiments. A measuring unit 650 according to the present exemplary embodiment differs from the measuring unit 150 and the like according to the first exemplary embodiment in a position at which the wavelength variable unit 140 is arranged. FIG. 8 is a diagram illustrating the measuring unit 650 according to the present exemplary embodiment. In the measuring unit 650, the wavelength variable unit 140 is arranged between the beam splitter 68 and the detection unit 75 in such a manner that light from the pattern 72 is reflected by the beam splitter 68 and is incident on the wavelength variable unit 140 before light is incident on the detection unit 75.

Light (first light) emitted from the light source 61 is incident on the illumination aperture stop 64 via the illumination optical system (first optical system) 63. Light transmitted through the illumination aperture stop 64 is incident on the beam splitter 68 via the relay lens 67. Light transmitted through the beam splitter 68 is transmitted through the quarter-wavelength plate 70 via the aperture stop 69, converted into circularly-polarized light, and is used for Kohler illumination of the pattern 72 provided on the substrate 73, via the objective optical system 71.

Light (second light) from the pattern 72 is transmitted through the quarter-wavelength plate 70 via the objective optical system 71, converted from the circularly-polarized light into S-polarized light, and is incident on the aperture stop 69. Light transmitted through the aperture stop 69 is reflected by the beam splitter 68, and is guided to the wavelength variable unit 140 via the image forming optical system (second optical system) 74. Light transmitted through the wavelength variable unit 140 is then incident on the detection unit 75 via a lens 76.

In the present exemplary embodiment, by performing alignment of the wavelength variable unit 140 using the drive unit 41 based on a preliminarily-acquired relationship between the position of the wavelength variable unit 140 in a predetermined direction vertical to an optical axis, and a wavelength of light to be transmitted through the wavelength variable unit 140, light having a desired wavelength is incident on the detection unit 75. Here, the predetermined direction vertical to the optical axis is a direction vertical to the optical axis of the image forming optical system 74 or the lens 76, and is the Z-axis direction or the Y-axis direction, for example. The drive unit 41 may also move a position in a predetermined rotational direction of the wavelength variable unit 140 by driving the wavelength variable unit 140 not only in a predetermined direction (e.g., the Z-axis direction) vertical to an optical axis, but also in a rotational direction (e.g., the θZ direction) about a predetermined axis vertical to the optical axis.

As described above, the measuring device according to the present exemplary embodiment causes light with a desired wavelength to be incident on a detection unit, so that the intensity of a detected signal of light can be increased, thus reducing an error of the detected signal.

Figure 9:
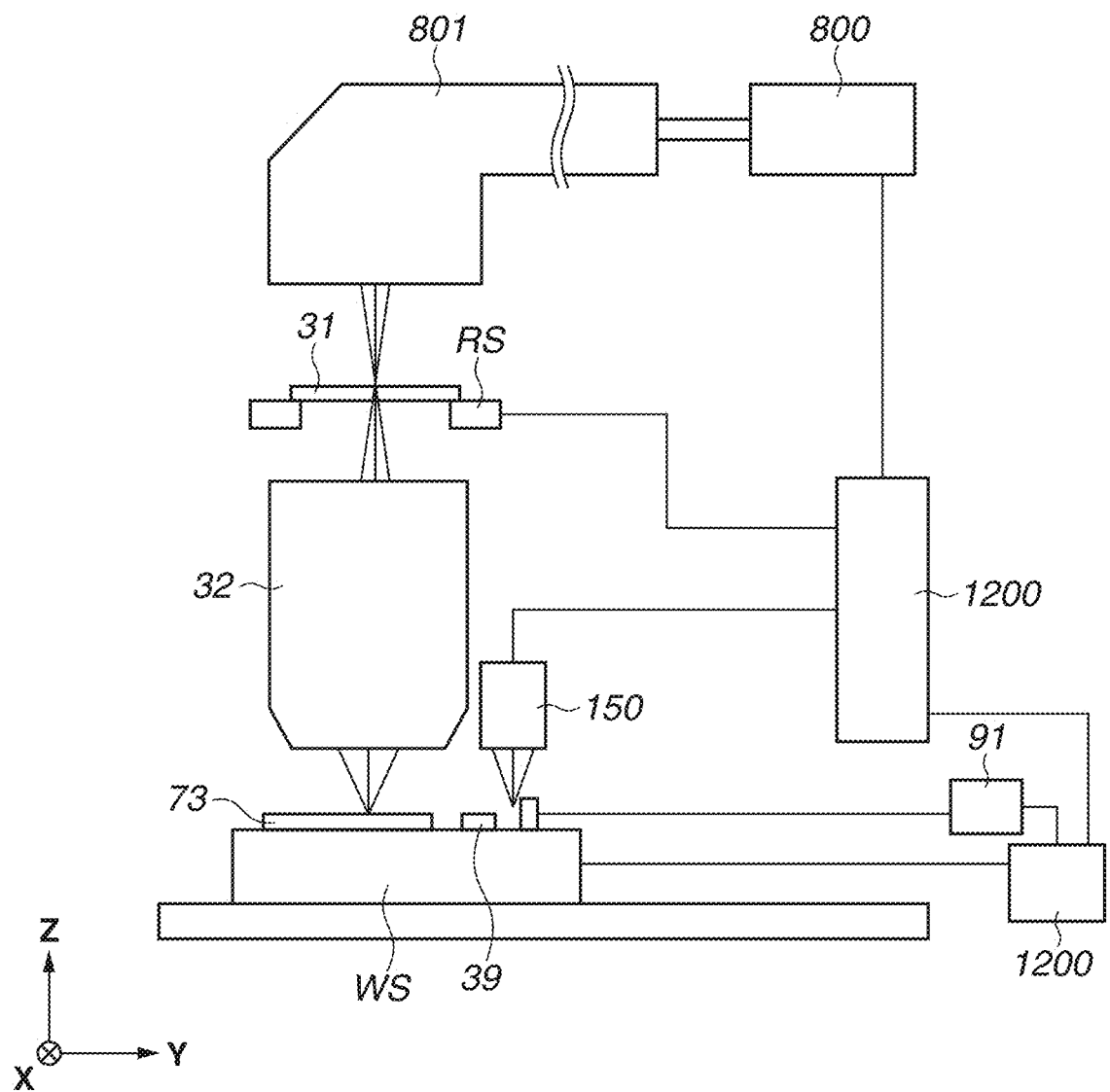
FIG. 9 is a diagram illustrating an exposure apparatus according to a seventh exemplary embodiment.

A seventh exemplary embodiment of the present invention will be described below. In the present exemplary embodiment, a configuration in which an exposure apparatus serving as a substrate processing apparatus includes a measuring device will be described. Matters not mentioned in the present exemplary embodiment can conform to those in the first to fifth exemplary embodiments. An exposure apparatus according to the present exemplary embodiment will be described with reference to FIG. 9. An exposure apparatus EXA is a lithography apparatus which is used in a lithography process and forms a pattern onto the substrate 73. The lithography process is a manufacturing process of a device, such as a semiconductor device or a liquid crystal display element. The exposure apparatus EXA performs exposure processing of exposing the substrate 73 (wafer) to light via a reticle (original plate, mask) 31, and transferring a pattern of the reticle 31 onto the substrate 73 (processing on the substrate).

The reticle 31 is a reticle, an original plate, or a mask on which a predetermined pattern such as a circuit pattern is formed, and is made of quartz, for example. The reticle 31 allows light emitted by an illumination optical system 801 (described below) to pass therethrough. The substrate 73 is an object to be processed onto which the pattern of the reticle 31 is to be transferred. Examples of the substrate 73 include a silicon wafer, a glass plate, a film substrate, and other substrates to be processed, for example. By the substrate 73 being exposed to light in a state in which a photoresist is applied, a pattern is transferred onto the substrate 73.

A description will be provided of an example case where a scanning-type exposure apparatus (scanner) that performs light exposure on a pattern formed on the reticle 31, onto the substrate 73 while moving the reticle 31 and the substrate 73 in a scanning direction in synchronization with each other is used as the exposure apparatus EXA. The present exemplary embodiment can also be applied to an exposure apparatus (stepper) of a type of performing light exposure a reticle pattern onto the substrate 73 in a state in which the reticle 31 is fixed.

The exposure apparatus EXA includes a light source unit 800, the illumination optical system 801, a reticle stage RS, a projection optical system 32, the substrate stage WS, the measuring unit 150, and the control unit 1100.

The light source unit 800 includes at least one light source of a mercury lamp, a KrF excimer laser, and an ArF excimer laser. The light source unit 800 may include an extreme ultraviolet (EUV) light source emitting EUV light with a wavelength of several nm to 100 nm.

The illumination optical system 801 forms light emitted from the light source unit 800, into slit light having a predetermined shape optimum for exposure, emits the light onto the reticle 31 held by the reticle stage RS, and illuminates a predetermined illumination region on the reticle 31. The illumination optical system 801 illuminates the predetermined illumination region on the reticle 31 with light having a uniform illuminance distribution. The illumination optical system 801 includes a lens, a mirror, an optical integrator, and a stop, for example. A condenser lens, a fly-eye lens, an aperture stop, a condenser lens, a slit, and an image forming optical system are arranged in this order in the illumination optical system 801.

The reticle stage RS moves while holding the reticle 31. The reticle stage RS is movable within a plane (i.e., XY plane) vertical to the optical axis of the projection optical system 32, for example, and rotatable in the θZ direction. The reticle stage RS is driven by a drive device (not illustrated) such as a linear motor. The drive device is drivable in three axis directions corresponding to the X, Y, and θZ directions, and is controlled by the control unit 1100 to be described below. The drive device is assumed to be drivable in three axis directions, but may be drivable in any number of directions from one axis direction to six axis directions.

The projection optical system 32 emits light transmitted through the reticle 31, onto the substrate 73 held by the substrate stage WS, and projects an image of a pattern formed on the reticle 31, onto the substrate 73 at a predetermined projection magnification β. In this manner, the substrate 73 is exposed to light emitted from the projection optical system 32, and a pattern is formed on the substrate 73. The projection optical system 32 includes a plurality of optical elements. The predetermined projection magnification β is ¼ or ⅕, for example.

For the substrate stage WS, a description of the configuration similar to that of the first exemplary embodiment will be omitted.

A reference plate 39 including a reference mark is installed on the substrate stage WS. The height of the surface of the reference plate 39 is defined in such a manner so as to be the same height as the surface of the substrate 73 held by the substrate stage WS. The measuring unit 150 also measures the position of the reference mark of the reference plate 39.

The control unit 1100 comprehensively controls components of the exposure apparatus EXA including the measuring device 100.

The configuration of the control unit 1100 is similar to that in the first exemplary embodiment, and thus, a description thereof will be omitted.

The measuring unit 150 is similar to that in the first exemplary embodiment, and thus, a description thereof will be omitted. In the present exemplary embodiment, a configuration in which the measuring device and the measuring method according to the first exemplary embodiment are used will be described. Alternatively, the measuring device and the measuring method according to any of the second to fifth exemplary embodiments may be used.

Figure 10:
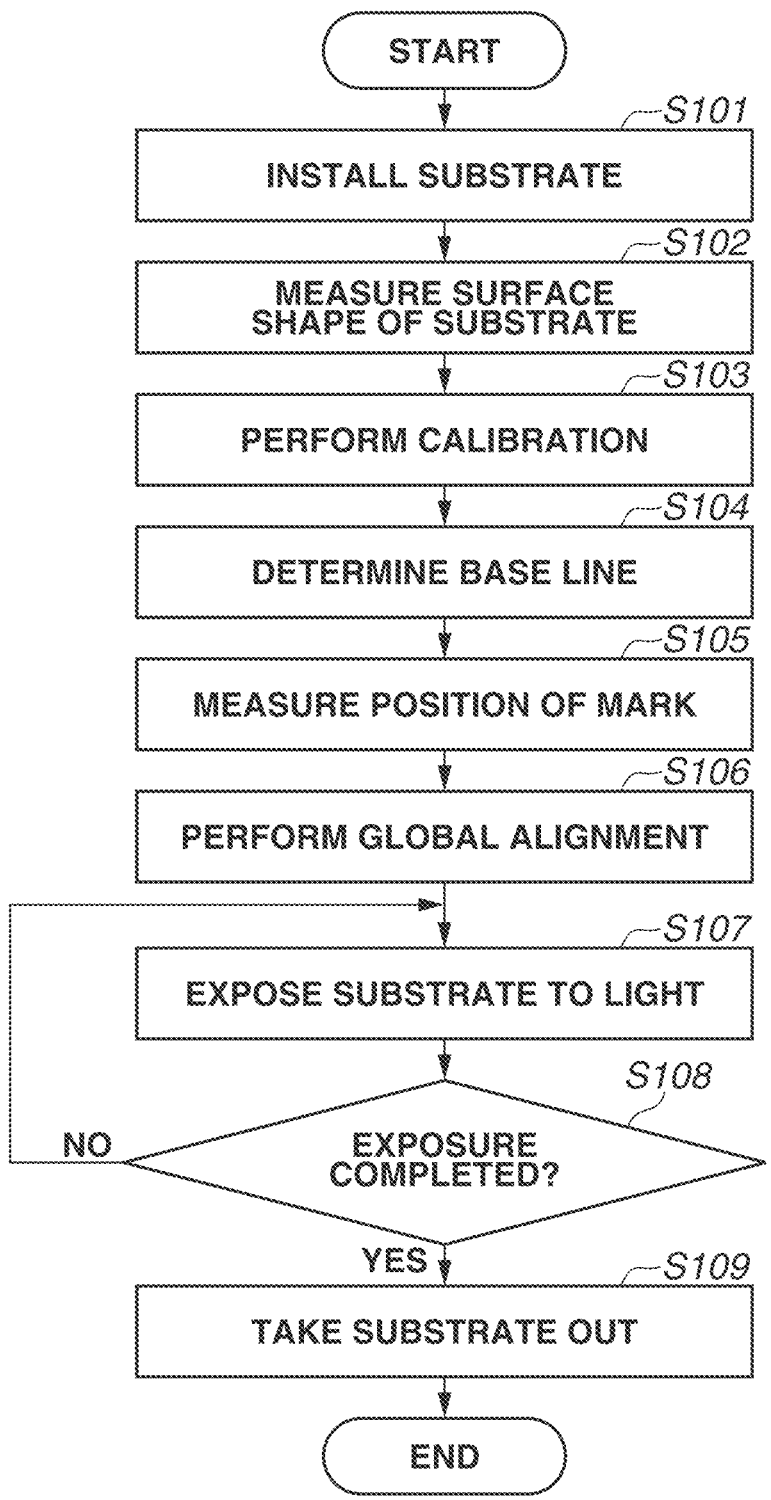
FIG. 10 is a flowchart illustrating exposure processing according to the seventh exemplary embodiment.

Next, exposure processing according to the present exemplary embodiment will be described with reference to FIG. 10. The exposure processing illustrated in FIG. 10 is performed by the control unit 1100 comprehensively controlling the components of the exposure apparatus EXA.

In step S101, the control unit 1100 installs the substrate 73 into the exposure apparatus EXA. In step S102, the control unit 1100 causes a shape measuring device (not illustrated) to detect the surface (height) of the substrate 73 and measure a surface shape of the entire region of the substrate 73.

In step S103, the control unit 1100 performs calibration. More specifically, based on the position of the reference mark provided on the reference plate 39, the control unit 1100 drives the substrate stage WS in such a manner that the reference mark is positioned on the optical axis of the measuring unit 150. Next, the control unit 1100 measures a positional shift of the reference mark with respect to the optical axis of the measuring unit 150, and based on the positional shift, resets a coordinate system of the substrate stage WS in such a manner that an origin of the coordinate system of the substrate stage WS coincides with the optical axis of the measuring unit 150. Next, based on a positional relationship between the optical axis of the measuring unit 150 and the optical axis of the projection optical system 32, the control unit 1100 drives the substrate stage WS in such a manner that the reference mark is positioned on an optical axis of exposure light. The control unit 1100 causes a through-the-lens (TTL) measurement system (not illustrated) to measure a positional shift of the reference mark with respect to the optical axis of exposure light via the projection optical system 32. In step S104, the control unit 1100 determines a base line of the optical axis of the measuring unit 150 and the optical axis of the projection optical system 32 based on a calibration result obtained in step S103.

In order to measure a positional shift of the reference mark in step S103, pattern measurement processing illustrated in FIG. 2B is performed. The control unit 1100 measures a pattern included in the reference mark, using the measuring unit 150. In the case of measuring a plurality of reference marks, there is no need to perform the operations in steps S121 to S123 of FIG. 2B, for each of the plurality of reference marks. The operations in steps S121 to S123 of FIG. 2B may be performed each time measurement is performed a predetermined number of times, or may be performed every predetermined number of substrates 73 on which exposure processing is performed, for example.

In step S105, the control unit 1100 causes the measuring unit 150 to measure the position of a mark provided on the substrate 73. In step S106, the control unit 1100 performs global alignment. More specifically, based on a measurement result obtained in step S105, the control unit 1100 calculates shift, magnification, and rotation regarding an array of shot regions of the substrate 73, and obtains the regularity of the array of shot regions. A correction coefficient is obtained from the regularity of the array of the shot regions and the base line, and alignment of the substrate 73 is performed with respect to the reticle 31 (exposure light) based on the correction coefficient.

In order to measure the position of the mark in step S105, the pattern measurement processing illustrated in FIG. 2B is performed. The control unit 1100 measures a pattern included in the mark, using the measuring unit 150. In the case of measuring a plurality of marks, there is no need to perform the operations in steps S121 to S123 of FIG. 2B, for each of the plurality of marks. The operations in steps S121 to S123 of FIG. 2B may be performed each time measurement is performed a predetermined number of times, or may be performed every predetermined number of substrates 73 on which exposure processing is performed, for example.

In step S107, the control unit 1100 exposes the substrate 73 to light while controlling the reticle stage RS and the substrate stage WS in such a manner as to move the reticle 31 and the substrate 73 in the scanning direction (Y direction). At this time, based on the surface shape of the substrate 73 that has been measured by the shape measuring device, the control unit 1100 drives the substrate stage WS in the Z direction and a tilt direction, and sequentially match the surface of the substrate 73 with an image forming surface of the projection optical system 32.

In step S108, the control unit 1100 determines whether exposure has been completed for all shot regions of the substrate 73 that are to be exposed to light (i.e., whether no unexposed shot region remains among the shot regions to be exposed to light). If it is determined that exposure for all the shot regions to be exposed to light has not been completed (NO in step S108), the control unit 1100 returns the processing to step S107. In other words, the operations in steps S107 and S108 are repeated until exposure for all the shot regions to be exposed to light is completed. By contrast, if it is determined that exposure for all the shot regions to be exposed to light has been completed (YES in step S108), the control unit 1100 advances the processing to step S109. In step S109, the control unit 1100 takes the substrate 73 out from the exposure apparatus EXA.

<Manufacturing Method of Product>

A method of manufacturing, a product, such as a device (semiconductor device, magnetic storage medium, liquid crystal display element, etc.), a color filter, and a hard disc will be described. The manufacturing method includes a step of forming a pattern onto a substrate (wafer, glass plate, film-shaped substrate, etc.) using a lithography apparatus (e.g., exposure apparatus, imprint apparatus, drawing apparatus, etc.). The manufacturing method further includes a step of processing the substrate on which the pattern has been formed. The step of processing can include a step of removing a residual film of the pattern. The step of processing can include a known another step such as a step of etching the substrate using the pattern as a mask. The manufacturing method of a product according to the present exemplary embodiment is advantageous in at least one of performance, quality, productivity, and production cost of the product as compared with the typical technique.

According to an exemplary embodiment of the present invention, it is possible to provide a measuring device, a measuring method, a substrate processing apparatus, and a manufacturing method of a product that can increase the intensity of a detected signal of light, and can reduce an error of the detected signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The exposure apparatus has been described as an example of the substrate processing apparatus, but the substrate processing apparatus is not limited to this. As an example of the substrate processing apparatus, an imprint apparatus that forms an imprint material pattern onto a substrate using a mold (template) including an uneven pattern may be used. As an example of the substrate processing apparatus, a planarization apparatus that forms a shape in such a manner as to planarize a composition on a substrate using a mold (planar template) including a planer portion without an uneven pattern may be used. As an example of the substrate processing apparatus, an apparatus such as a drawing apparatus that forms a pattern onto a substrate by performing drawing onto the substrate using charged particle radiation (electron beams or ion beams, etc.) via σ charged-particle optical system may be used.

The first to seventh exemplary embodiments can also be executed in combination with any of the first to sixth exemplary embodiments in addition to being executed independently.

This application claims the benefit of Japanese Patent Application No. 2021-124628, filed Jul. 29, 2021, which is hereby incorporated by reference herein in its entirety.

What is claimed is:

1. A measuring device for measuring a position of a pattern by detecting second light from the pattern illuminated with first light, the measuring device comprising:
   a wavelength variable unit including a member configured to vary a wavelength of the first light transmitting through the wavelength variable unit in accordance with an incident position at which the first light is incident to allow the first light to pass therethrough, and an opening;
   a detection unit configured to detect an intensity of the second light from the pattern illuminated with the first light transmitted through the wavelength variable unit; and
   a moving unit configured to move the wavelength variable unit based on a position of the wavelength variable unit when the first light enters into the opening, such that the wavelength of the first light transmitted through the member varies to a desired wavelength,
   wherein the position of the wavelength variable unit is determined based on a predefined correlation between the position of the member and the position of the opening.

2. The measuring device according to claim 1, wherein the moving unit moves the wavelength variable unit in a predetermined direction in a surface of the wavelength variable unit illuminated with the first light.

3. The measuring device according to claim 1, further comprising a first optical system configured to guide the first light emitted from a light source, to the wavelength variable unit.

4. The measuring device according to claim 1,
wherein intensity characteristic information is acquired based on the intensity of the second light that has been detected by the detection unit.

5. The measuring device according to claim 4, further comprising a second optical system configured to guide the second light from the pattern to the detection unit.

6. The measuring device according to claim 4, further comprising a beam splitter configured to allow the first light transmitted through the wavelength variable unit to pass therethrough, split the second light from the pattern, and guide the split light to the detection unit.

7. The measuring device according to claim 4, wherein the intensity characteristic information is acquired by repeatedly moving the wavelength variable unit by a predetermined movement amount using the moving unit, and detecting the intensity of the second light using the detection unit.

8. The measuring device according to claim 4, wherein the intensity characteristic information is acquired by repeatedly moving the wavelength variable unit using the moving unit by a movement amount varied depending on the position of the wavelength variable unit, and detecting the intensity of the second light using the detection unit.

9. The measuring device according to claim 1, further comprising a spectroscopic detection unit configured to detect a wavelength of the first light transmitted through the wavelength variable unit,
wherein wavelength characteristic information is acquired based on the position of the wavelength variable unit and the wavelength detected by the spectroscopic detection unit.

10. The measuring device according to claim 1, further comprising a control unit configured to perform control to cause the moving unit to move the wavelength variable unit to the determined position.

11. A substrate processing apparatus for processing a substrate on which a pattern has been formed, the substrate processing apparatus comprising:
the measuring device according to claim 1,
wherein the substrate aligned based on a position of the pattern that has been measured by the measuring device is processed.

12. The measuring device according to claim 1, wherein the moving unit moves the wavelength variable unit based on a distance between an incident position of the first light of the member and a position of the opening.

13. The measuring device according to claim 1, wherein the incident position is acquired based on wavelength characteristic information indicating a relationship between the position of the wavelength variable unit and the wavelength of the first light transmitted through the member.

14. The measuring device according to claim 13, wherein the wavelength characteristic information is corrected based on the intensity of the second light from the pattern and the intensity of the second light from a surface having a height different from a height of a surface on which the pattern is formed.

15. The measuring device according to claim 14, wherein the wavelength characteristic information is corrected based on the intensity of the second light from a first pattern included in the pattern and the intensity of the second light from a second pattern that is included in the pattern and has a height different from that of the first pattern.

16. The measuring device according to claim 1, wherein the position of the wavelength variable unit when the first light enters into the opening, is acquired based on intensity characteristic information indicating a relationship between the position of the wavelength variable unit and the intensity of the second light from the pattern illuminated with the first light transmitted through the wavelength variable unit.

17. The measuring device according to claim 16, wherein the intensity characteristic information is acquired based on the intensity of the second light obtained by moving the wavelength variable unit by the moving unit.

18. A measuring device for measuring a position of a pattern by detecting second light from the pattern illuminated with first light, the measuring device comprising:
a wavelength variable unit including a member configured to vary a wavelength of the second light transmitting through the wavelength variable unit in accordance with an incident position at which the second light is incident to allow the second light to pass therethrough, and an opening;
a detection unit configured to detect an intensity of the second light from the pattern illuminated with the first light transmitted through the wavelength variable unit; and
a moving unit configured to move the wavelength variable unit based on a position of the wavelength variable unit when the second light enters into the opening, such that the wavelength of the second light transmitted through the member varies to a desired wavelength, and
wherein the position of the wavelength variable unit is determined based on a predefined correlation between the position of the member and the position of the opening.

19. A measuring method of measuring a position of a pattern by detecting second light from the pattern illuminated with first light, the measuring method comprising:
detecting an intensity of the second light from the pattern illuminated with the first light transmitted through a wavelength variable unit, which includes a member configured to vary a wavelength of the first light transmitting through the wavelength variable unit in accordance with an incident position at which the first light is incident to allow the first light to pass therethrough, and an opening,
moving the wavelength variable unit based on a position of the wavelength variable unit when the first light enters into the opening, such that the wavelength of the first light transmitted through the member varies to a desired wavelength, wherein the position of the wavelength variable unit is determined based on a predefined correlation between the position of the member and the position of the opening; and
after moving the wavelength variable unit, measuring a position of the pattern by detecting an intensity of the second light from the pattern illuminated with the first light transmitted through the member.

20. A method of manufacturing a product, the method comprising:
measuring a position of a pattern formed on a substrate by detecting second light from the pattern illuminated with first light;
aligning the substrate based on the measured position of the pattern;
processing the aligned substrate; and
manufacturing a product from the processed substrate, wherein the measuring includes:
  detecting an intensity of the second light from the pattern illuminated with the first light transmitted through a wavelength variable unit, which includes a member configured to vary a wavelength of the first light transmitting through the wavelength variable unit in accordance with an incident position at which the first light is incident to allow the first light to pass therethrough, and an opening,
  moving the wavelength variable unit based on a position of the wavelength variable unit when the first light enters into the opening, such that the wavelength of the first light transmitted through the member varies to a desired wavelength, wherein the position of the wavelength variable unit is determined based on a predefined correlation between the position of the member and the position of the opening; and
  after moving the wavelength variable unit, measuring a position of the pattern by detecting an intensity of the second light from the pattern illuminated with the first light transmitted through the member.

21. A measuring device for measuring a position of a pattern by detecting light from the pattern, the measuring device comprising:
  a wavelength variable unit including a member configured to vary a wavelength of light transmitted through the wavelength variable unit in accordance with an incident position at which the transmitted light is incident to allow the transmitted light to pass therethrough, and an opening; and
  a moving unit configured to move the wavelength variable unit based on a determined position of the wavelength variable unit when the transmitted light enters into the opening, such that the wavelength of the transmitted light transmitted through the member varies to a desired wavelength,
  wherein the determined position is based on a predefined correlation between the position of the member and the position of the opening.

22. The measuring device according to claim 21, further comprising a detection unit configured to detect the intensity of the transmitted light,
  wherein intensity characteristic information is acquired based on the intensity of the transmitted light that has been detected by the detection unit.

23. The measuring device according to claim 22, wherein the intensity characteristic information is acquired by repeatedly moving the wavelength variable unit by a predetermined movement amount using the moving unit, and detecting the intensity of the transmitted light using the detection unit.

24. The measuring device according to claim 22, wherein the intensity characteristic information is acquired by repeatedly moving the wavelength variable unit using the moving unit by a movement amount varied depending on the position of the wavelength variable unit, and detecting the intensity of the transmitted light using the detection unit.

25. The measuring device according to claim 21, wherein the moving unit moves the wavelength variable unit based on a distance between an incident position of the transmitted light of the member and a position of the opening.

26. The measuring device according to claim 21, wherein the incident position is acquired based on wavelength characteristic information indicating a relationship between the position of the wavelength variable unit and the wavelength of the transmitted light transmitted through the member.

27. The measuring device according to claim 21, wherein the position of the wavelength variable unit when the transmitted light enters into the opening, is acquired based on intensity characteristic information indicating a relationship between the position of the wavelength variable unit and the intensity of the transmitted light.

28. The measuring device according to claim 27, wherein the intensity characteristic information is acquired based on the intensity of the transmitted light obtained by moving the wavelength variable unit by the moving unit.

* * * * *